US012733287B2

(12) United States Patent
Mizuta

(10) Patent No.: US 12,733,287 B2
(45) Date of Patent: Sep. 8, 2026

(54) SOLID-STATE IMAGING DEVICE, METHOD FOR MANUFACTURING THE SAME, AND ELECTRONIC APPARATUS

(71) Applicant: SONY SEMICONDUCTOR SOLUTIONS CORPORATION, Kanagawa (JP)

(72) Inventor: Kyohei Mizuta, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 312 days.

(21) Appl. No.: 18/491,450

(22) Filed: Oct. 20, 2023

(65) Prior Publication Data

US 2024/0047499 A1 Feb. 8, 2024

Related U.S. Application Data

(63) Continuation of application No. 16/964,674, filed as application No. PCT/JP2019/001380 on Jan. 18, 2019, now Pat. No. 11,942,502.

(30) Foreign Application Priority Data

Feb. 1, 2018 (JP) ................................ 2018-016493

(51) Int. Cl.
*H10F 39/00* (2025.01)
*H04N 25/67* (2023.01)
(Continued)

(52) U.S. Cl.
CPC ........... *H10F 39/811* (2025.01); *H04N 25/67* (2023.01); *H04N 25/70* (2023.01); *H04N 25/77* (2023.01);
(Continued)

(58) Field of Classification Search
CPC .................................................... H10F 39/199
See application file for complete search history.

(56) References Cited

U.S. PATENT DOCUMENTS 8,773,562 B1 7/2014 Fan
11,942,502 B2 * 3/2024 Mizuta .................. H10F 39/182
(Continued)

FOREIGN PATENT DOCUMENTS

CN 102005460 4/2011
CN 104733484 6/2015
(Continued)

OTHER PUBLICATIONS

International Search Report and Written Opinion for International (PCT) Patent Application No. PCT/JP2019/001380, dated Apr. 16, 2019, 6 pages.
(Continued)

*Primary Examiner* — Benjamin P Sandvik
(74) *Attorney, Agent, or Firm* — SHERIDAN ROSS P.C.

(57) ABSTRACT

The present technology relates to a solid-state imaging device compatible with miniaturization of pixels, a method for manufacturing the solid-state imaging device, and an electronic apparatus. The solid-state imaging device is formed by joining a front surface side as the wiring layer formation surface of the first semiconductor substrate to a back surface side of the second semiconductor substrate. The first semiconductor substrate includes a photodiode and a transfer transistor. The second semiconductor substrate includes a charge/voltage retention portion that retains the electric charge transferred by the transfer transistor or the voltage corresponding to the electric charge. The solid-state imaging device includes a through electrode that penetrates the second semiconductor substrate, and transmits the electric charge or the voltage to the charge/voltage retention
(Continued)

portion. The present technology can be applied to solid-state imaging devices and the like, for example.

20 Claims, 19 Drawing Sheets

(51) Int. Cl.

| | |
|---|---|
| ***H04N 25/70*** | (2023.01) |
| ***H04N 25/77*** | (2023.01) |
| ***H04N 25/79*** | (2023.01) |
| ***H10F 39/12*** | (2025.01) |
| ***H10F 39/18*** | (2025.01) |
| ***H10W 20/00*** | (2026.01) |
| ***H10W 20/42*** | (2026.01) |
| ***H10W 90/00*** | (2026.01) |

(52) U.S. Cl.
CPC ........... *H04N 25/79* (2023.01); *H10F 39/018* (2025.01); *H10F 39/12* (2025.01); *H10F 39/182* (2025.01); *H10F 39/8057* (2025.01); *H10F 39/8063* (2025.01); *H10F 39/809* (2025.01); *H10F 39/812* (2025.01); *H10W 20/023* (2026.01); *H10W 20/42* (2026.01); *H10W 90/00* (2026.01)

(56) References Cited

U.S. PATENT DOCUMENTS

| | | | |
|---|---|---|---|
| 2005/0093036 | A1 | 5/2005 | Han |
| 2011/0049336 | A1 | 3/2011 | Matsunuma |
| 2012/0086845 | A1 | 4/2012 | Enomoto et al. |
| 2013/0092820 | A1 | 4/2013 | Takemoto |
| 2013/0112849 | A1 | 5/2013 | Shimotsusa |
| 2014/0091414 | A1 | 4/2014 | Shimotsusa |
| 2014/0176770 | A1 | 6/2014 | Kondo |
| 2015/0054110 | A1 | 2/2015 | Kashihara |
| 2015/0179691 | A1 | 6/2015 | Yanagita et al. |
| 2015/0263053 | A1 | 9/2015 | Yamazaki et al. |
| 2015/0325606 | A1 | 11/2015 | Togashi et al. |
| 2015/0349129 | A1 | 12/2015 | Ikeda |
| 2016/0284753 | A1 | 9/2016 | Komai et al. |
| 2017/0033144 | A1 | 2/2017 | Takahashi |
| 2017/0162625 | A1 | 6/2017 | Takayanagi et al. |
| 2018/0076252 | A1 | 3/2018 | Togashi et al. |
| 2018/0197919 | A1 | 7/2018 | Lee et al. |
| 2018/0301509 | A1 | 10/2018 | Ishii et al. |
| 2019/0043901 | A1 | 2/2019 | Honda et al. |
| 2020/0105814 | A1 | 4/2020 | Hashiguchi et al. |
| 2021/0057479 | A1 | 2/2021 | Mizuta |
| 2021/0084249 | A1* | 3/2021 | Nakazawa ............ H10F 39/811 |

FOREIGN PATENT DOCUMENTS

| | | |
|---|---|---|
| CN | 105474394 | 4/2016 |
| CN | 105593995 | 5/2016 |
| CN | 107004689 | 8/2017 |
| JP | 2010-219339 | 9/2010 |
| JP | 2011-049445 | 3/2011 |
| JP | 2012004443 A | 1/2012 |
| JP | 2013-090127 | 5/2013 |
| JP | 2014-036306 | 2/2014 |
| JP | 2014-099582 | 5/2014 |
| JP | 2015095468 A | 5/2015 |
| JP | 2016534557 A | 11/2016 |
| JP | 2017-157816 | 9/2017 |
| KR | 10-2015-006527 | 6/2015 |
| WO | WO 2016/136486 | 9/2016 |
| WO | WO-2017057277 A1 | 4/2017 |

OTHER PUBLICATIONS

Extended European Search Report for European Patent Application No. 19747037.0, dated Feb. 17, 2021, 8 pages.
Official Action for U.S. Appl. No. 16/964,674, dated Mar. 11, 2022, 12 pages.
Official Action for U.S. Appl. No. 16/964,674, dated Aug. 11, 2022, 9 pages.
Official Action for U.S. Appl. No. 16/964,674, dated Nov. 30, 2022, 8 pages.
Official Action for U.S. Appl. No. 16/964,674, dated Jun. 2, 2023, 8 pages.
Notice of Allowance for U.S. Appl. No. 16/964,674, dated Oct. 30, 2023, 8 pages.

* cited by examiner

A
B
121
122
123
71
72
84
p
43
41
54
M1
53
51
52
M2
55
Tr1
M3
G1
M4
PD
n
G6
M5
Tr6
M6
56
L1

A
B
82
81
71
72
43
41
p
PD
n
84
L1
54
M1
53
51
52
55
56
M2
M3
M4
M5
M6
G1
G6
Tr1
Tr6
85
86
87
88
89
G2
Gm
G3
G4
G5
Tr2
MEM
Tr3
Tr4
Tr5
M11
M12
M13
M14
M15
M16

A
B
PD
n
p
41
43
51
52
53
54
55
56
71
72
81
82
83A
84
85
86
87
88
89
91
92
93
94
95
96
97
98
99
101
131
132
133
134
141
142
143
144
145
L1
M1
M2
M3
M4
M5
M6
M11
M12
M13
M14
M15
M16
G1
G2
G3
G4
G5
G6
Gm
MEM
Tr1
Tr2
Tr3
Tr4
Tr5
Tr6

300

301 LENSES

302 SOLID-STATE IMAGING DEVICE

303 DSP CIRCUIT

304 FRAME MEMORY

305 DISPLAY UNIT

306 RECORDING UNIT

307 OPERATION UNIT

308 POWER SUPPLY UNIT

309

10001
10200
EXTERNAL CONTROL DEVICE
10200A
10101
10114A
10100
10112
IMAGING UNIT
10113
IMAGE PROCESSING UNIT
10114
WIRELESS COMMUNICATION UNIT
10117
CONTROL UNIT
10111
LIGHT SOURCE UNIT
10115
POWER FEEDER UNIT
10116
POWER SUPPLY UNIT 11000
11131
11110
11111
11112
11132
11133
11100
11102
11101
11121
11120
11200
CCU
LIGHT SOURCE DEVICE
INPUT DEVICE
TREATMENT TOOL CONTROL DEVICE
PNEUMOPERITONEUM DEVICE
RECORDER
PRINTER
11201
11203
11204
11205
11206
11207
11208
11202

SOLID-STATE IMAGING DEVICE, METHOD FOR MANUFACTURING THE SAME, AND ELECTRONIC APPARATUS

CROSS REFERENCE TO RELATED APPLICATIONS

This application is a continuation of U.S. patent application Ser. No. 16/964,674, filed 24 Jul. 2020, which is a national stage application under 35 U.S.C. 371 and claims the benefit of PCT Application No. PCT/JP2019/001380 having an international filing date of 18 Jan. 2019, which designated the United States, which PCT application claimed the benefit of Japanese Patent Application No. 2018-016493 filed 1 Feb. 2018, the entire disclosures of each of which are incorporated herein by reference.

TECHNICAL FIELD

The present technology relates to a solid-state imaging device, a method for manufacturing the solid-state imaging device, and an electronic apparatus. Particularly, the present technology relates to a solid-state imaging device designed to be able to cope with miniaturization of pixels, a method for manufacturing the solid-state imaging device, and an electronic apparatus.

BACKGROUND ART

A global shutter back-illuminated complementary metal oxide semiconductor (CMOS) image sensor includes a memory for temporarily storing electric charges (signals) transferred from photodiodes. In a case where a memory that temporarily stores electric charges generated by photodiodes is disposed in the same silicon layer in which the photodiodes are disposed, parasitic light sensitivity (PLS) characteristics are degraded. If sufficient light-blocking measures are taken to improve the PLS characteristics, the areas of the photodiodes will become small, and therefore, the saturation charge quantity Qs will be sacrificed.

In view of this, a stacked back-illuminated CMOS image sensor in which two semiconductor substrates are stacked, the photodiodes are disposed in a first semiconductor substrate on the light incident side, and the memory is disposed in a second semiconductor substrate, which is the other semiconductor substrate, has been developed (see Patent Documents 1 through 4, for example).

CITATION LIST

Patent Documents

Patent Document 1: Japanese Patent Application Laid-Open No. 2010-219339
Patent Document 2: Japanese Patent Application Laid-Open No. 2014-36306
Patent Document 3: WO 2016/136486 A
Patent Document 4: Japanese Patent Application Laid-Open No. 2014-99582

SUMMARY OF THE INVENTION

Problems to be Solved by the Invention

The stacked back-illuminated CMOS image sensor is further required to have a structure capable of coping with miniaturization of pixels.

The present technology has been developed in view of such circumstances, and is to cope with miniaturization of pixels.

Solutions to Problems

A solid-state imaging device according to a first aspect of the present technology includes: a first semiconductor substrate and a second semiconductor substrate, a front surface side as a wiring layer formation surface of the first semiconductor substrate being joined to a back surface side of the second semiconductor substrate on the opposite side from a wiring layer formation surface of the second semiconductor substrate, the first semiconductor substrate including: a photoelectric conversion portion that photoelectrically converts incident light; and a transfer transistor that transfers an electric charge of the photoelectric conversion portion, the second semiconductor substrate including a charge/voltage retention portion that retains the electric charge transferred by the transfer transistor or a voltage corresponding to the electric charge; and a through electrode that penetrates the second semiconductor substrate, and transmits the electric charge transferred from the transfer transistor or the voltage to the charge/voltage retention portion.

A method for manufacturing a solid-state imaging device according to a second aspect of the present technology includes: forming a photoelectric conversion portion and a transfer transistor in a first semiconductor substrate, the photoelectric conversion portion photoelectrically converting incident light, the transfer transistor transferring an electric charge of the photoelectric conversion portion; bonding a front surface side as a wiring layer formation surface of the first semiconductor substrate to a back surface side of the second semiconductor substrate on the opposite side from a wiring layer formation surface of the second semiconductor substrate; forming a charge/voltage retention portion in the second semiconductor substrate after the bonding, the charge/voltage retention portion retaining the electric charge transferred by the transfer transistor or a voltage corresponding to the electric charge; and forming a through electrode that penetrates the second semiconductor substrate, and transmits the electric charge transferred from the transfer transistor or the voltage to the charge/voltage retention portion.

An electronic apparatus according to a third aspect of the present technology includes a solid-state imaging device including: a first semiconductor substrate and a second semiconductor substrate, a front surface side as a wiring layer formation surface of the first semiconductor substrate being joined to a back surface side of the second semiconductor substrate on the opposite side from a wiring layer formation surface of the second semiconductor substrate, the first semiconductor substrate including: a photoelectric conversion portion that photoelectrically converts incident light; and a transfer transistor that transfers an electric charge of the photoelectric conversion portion, the second semiconductor substrate including a charge/voltage retention portion that retains the electric charge transferred by the transfer transistor or a voltage corresponding to the electric charge; and a through electrode that penetrates the second semiconductor substrate, and transmits the electric charge transferred from the transfer transistor or the voltage to the charge/voltage retention portion.

In the first and third aspects of the present technology, the front surface side as the wiring layer formation surface of the first semiconductor substrate is joined to the back surface side of the second semiconductor substrate on the opposite side from the wiring layer formation surface of the second semiconductor substrate. In the first semiconductor substrate, a photoelectric conversion portion that photoelectrically converts incident light, and a transfer transistor that transfers the electric charge of the photoelectric conversion portion are provided. In the second semiconductor substrate, a charge/voltage retention portion that retains the electric charge transferred by the transfer transistor or a voltage corresponding to the electric charge is provided. A through electrode penetrates the second semiconductor substrate, and transmits the electric charge transferred from the transfer transistor or the voltage to the charge/voltage retention portion.

In the second aspect of the present technology, a photoelectric conversion portion that photoelectrically converts incident light, and a transfer transistor that transfers the electric charge of the photoelectric conversion portion are formed in the first semiconductor substrate. The front surface side as the wiring layer formation surface of the first semiconductor substrate is bonded to the back surface side of the second semiconductor substrate on the opposite side from the wiring layer formation surface of the second semiconductor substrate. A charge/voltage retention portion that retains the electric charge transferred by the transfer transistor or a voltage corresponding to the electric charge is formed in the second semiconductor substrate after the bonding. A through electrode that penetrates the second semiconductor substrate and transmits the electric charge transferred from the transfer transistor or the voltage to the charge/voltage retention portion is formed.

The solid-state imaging device and the electronic apparatus may be independent devices, or may be modules to be incorporated into other apparatuses.

Effects of the Invention

According to the first through third aspects of the present technology, it is possible to cope with miniaturization of pixels.

Note that the effects of the present technology are not necessarily limited to the effects described herein, and may include any of the effects described in the present disclosure.

MODES FOR CARRYING OUT THE INVENTION

Figure 1:
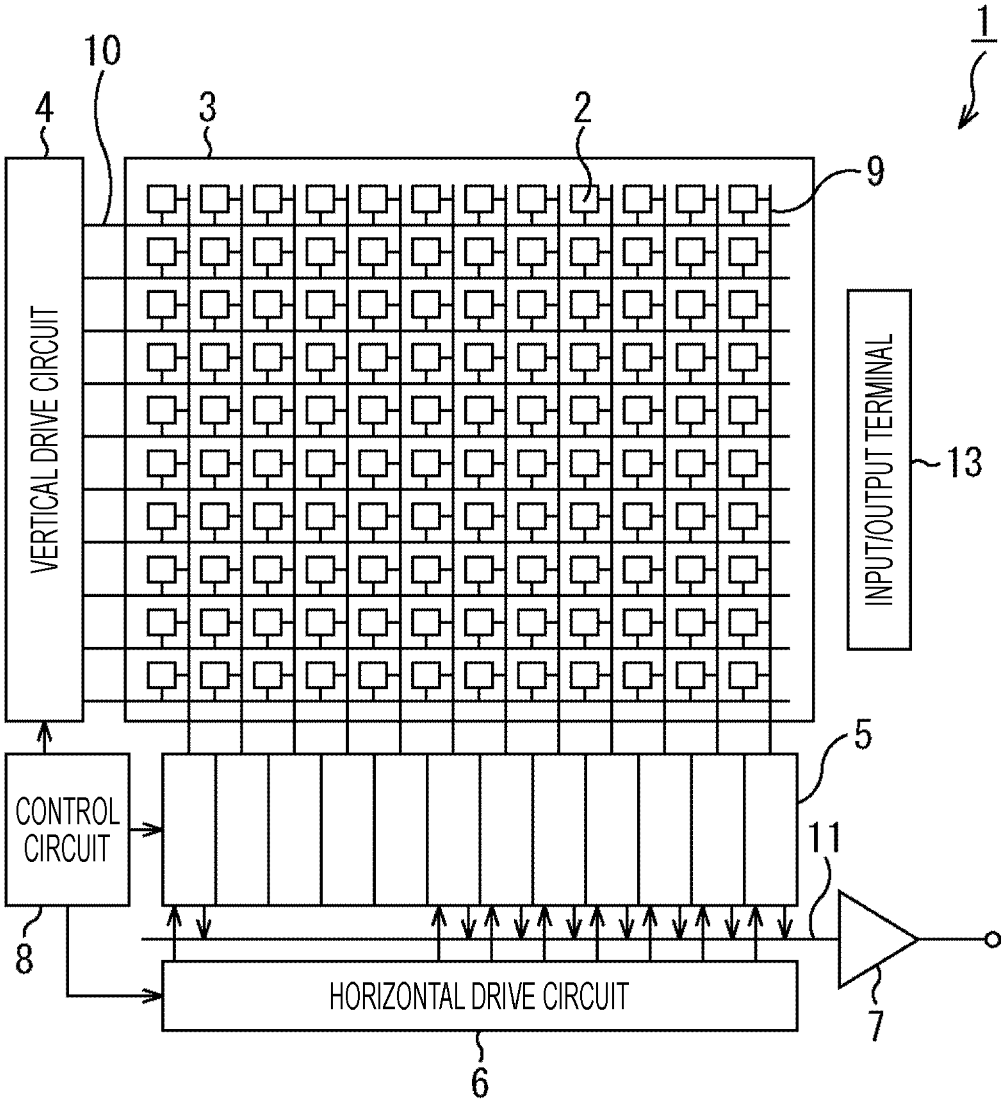
FIG. 1 is a block diagram schematically showing an example configuration of a solid-state imaging device to which the present technology is applied.

The following is a description of modes (hereinafter referred to as embodiments) for carrying out the present technology. Note that explanation will be made in the following order.

1. General example configuration of a solid-state imaging device
2. Example pixel circuit configuration of a first embodiment
3. Example cross-section configuration of the first embodiment
4. Manufacturing method according to the first embodiment
5. Example pixel circuit configuration of a second embodiment
6. Example cross-section configuration of the second embodiment
7. Example cross-section configuration of a three-layer stack structure
8. Example applications to electronic apparatuses
9. Example application to an in-vivo information acquisition system
10. Example application to an endoscopic surgery system
11. Example applications to mobile structures

1. General Example Configuration of a Solid-State Imaging Device

FIG. 1 schematically shows an example configuration of a solid-state imaging device to which present technology is applied.

A solid-state imaging device 1 shown in FIG. 1 includes a pixel array unit 3 having pixels 2 arranged in a two-dimensional array, and a peripheral circuit unit around the pixel array unit 3. The peripheral circuit unit includes a vertical drive circuit 4, column signal processing circuits 5, a horizontal drive circuit 6, an output circuit 7, a control circuit 8, and the like.

A pixel 2 includes a photodiode as a photoelectric conversion element, and pixel transistors. The pixel transistors are a transfer transistor, a selection transistor, a reset transistor, and an amplification transistor, for example, and are formed with MOS transistors.

The control circuit 8 receives an input clock and data that designates an operation mode and the like, and also outputs data such as internal information about the solid-state imaging device 1. Specifically, on the basis of a vertical synchronization signal, a horizontal synchronization signal, and a master clock, the control circuit 8 generates a clock signal and a control signal that serve as the references for operation of the vertical drive circuit 4, the column signal processing circuits 5, the horizontal drive circuit 6, and the like. The control circuit 8 then outputs the generated clock signal and control signal to the vertical drive circuit 4, the column signal processing circuits 5, the horizontal drive circuit 6, and the like.

The vertical drive circuit 4 is formed with a shift register, for example, selects a predetermined pixel drive line 10, supplies the selected pixel drive line 10 with a pulse for driving the pixels 2, and drives the pixels 2 on a row-by-row basis. Specifically, the vertical drive circuit 4 sequentially selects and scans the respective pixels 2 of the pixel array unit 3 on a row-by-row basis in the vertical direction, and supplies pixel signals based on signal charges generated in accordance with the amounts of light received in the photoelectric conversion portions of the respective pixels 2, to the column signal processing circuits 5 through vertical signal lines 9.

The column signal processing circuits 5 are provided for the respective columns of the pixels 2, and performs signal processing such as denoising, on a column-by-column basis, on signals that are output from the pixels 2 of one row. For example, the column signal processing circuits 5 perform signal processing such as correlated double sampling (CDS) for removing fixed pattern noise inherent to pixels and AD conversion.

The horizontal drive circuit 6 is formed with a shift register, for example, sequentially selects the respective column signal processing circuits 5 by sequentially outputting horizontal scan pulses, and causes the respective column signal processing circuits 5 to output pixel signals to a horizontal signal line 11.

The output circuit 7 performs signal processing on signals sequentially supplied from the respective column signal processing circuits 5 through the horizontal signal line 11, and outputs the processed signals. The output circuit 7 might perform only buffering in some cases, or might perform black level control, column variation correction, various kinds of digital signal processing, and the like in other cases, for example. An input/output terminal 13 exchanges signals with the outside.

The solid-state imaging device 1 having the configuration as above is a so-called column AD-type CMOS image sensor in which the column signal processing circuits 5 that perform CDS and AD conversion are provided for the respective pixel columns.

2. Example Pixel Circuit Configuration of a First Embodiment

Figure 2:
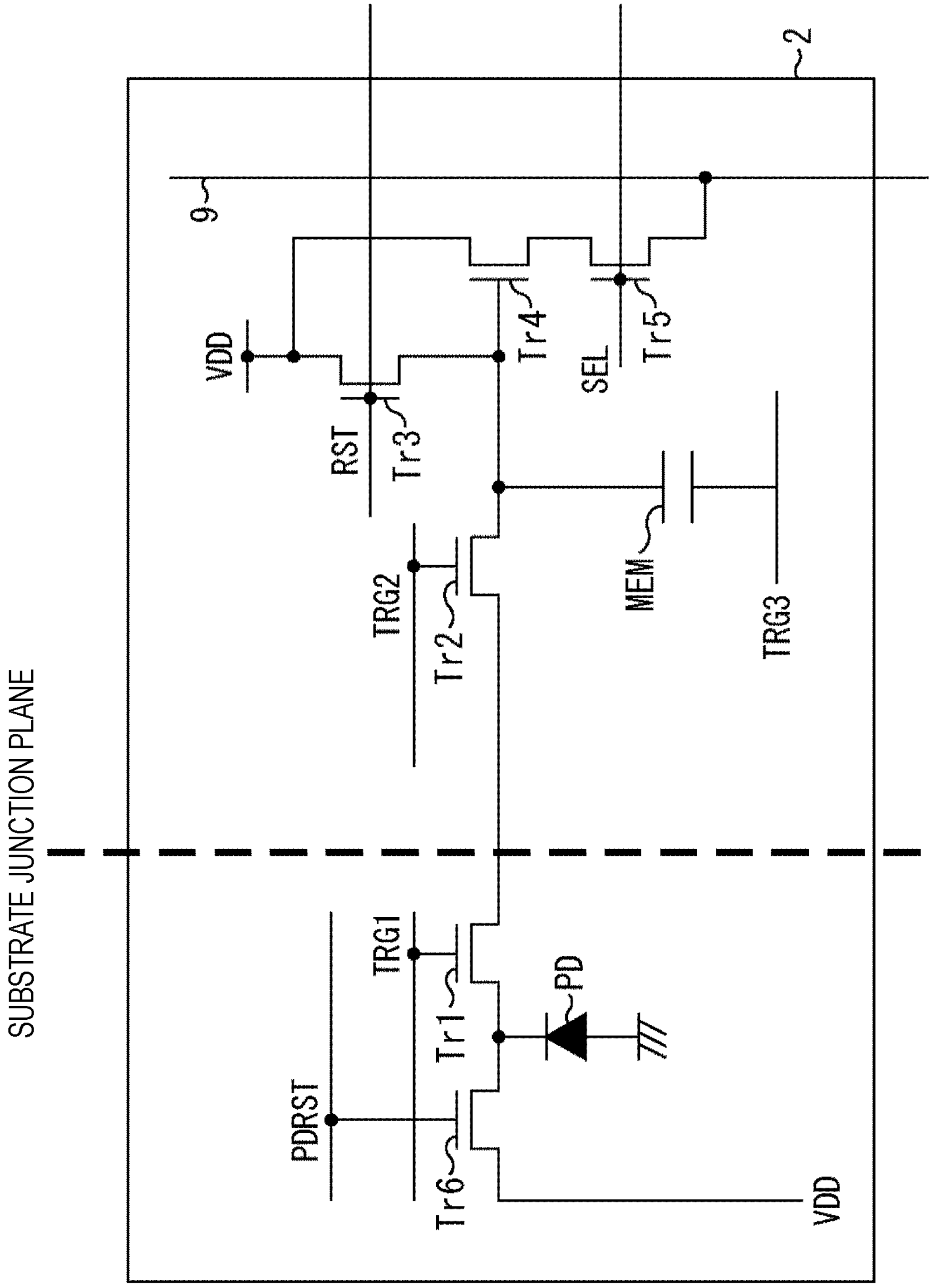
FIG. 2 is a diagram showing an example circuit configuration of a pixel according to a first embodiment.

FIG. 2 shows an example circuit configuration of a first embodiment of each pixel 2 shown in FIG. 1.

A pixel 2 includes a photodiode PD as a photoelectric conversion element, a first transfer transistor Tr1, a second transfer transistor Tr2, a reset transistor Tr3, an amplification transistor Tr4, a selection transistor Tr5, a drain transistor Tr6, and a memory portion MEM.

The photodiode PD is a photoelectric conversion portion that generates and stores electric charges (signal charges) depending on the amount of received light. The anode terminal of the photodiode 21 is grounded, and the cathode terminal is connected to the memory portion MEM via the first transfer transistor Tr1 and the second transfer transistor Tr2. The cathode terminal of the photodiode 21 is also connected to the drain transistor Tr6.

When turned on by a transfer signal TRG1, the first transfer transistor Tr1 reads out the electric charges generated by the photodiode PD, and transfers the electric charges to the second transfer transistor Tr2. When turned on by a transfer signal TRG2, the second transfer transistor Tr2 transfers the electric charges transferred from the first transfer transistor Tr1 to the memory portion MEM.

The memory portion MEM is a charge retention portion that temporarily retains the electric charges transferred from the photodiode PD, until outputting the electric charges via a vertical signal line 9. A control potential TRG3 that performs control to completely transfer the electric charges from the photodiode PD is applied to a second electrode on the opposite side of the memory portion MEM from a first electrode connected to the drain of the second transfer transistor Tr2 and the gate of the amplification transistor Tr4.

Note that, as the memory portion MEM, it is preferable to use the capacitance of a metal-insulator-metal (MIM) structure that is a capacitor with a small leak current (dark current) per unit area, the capacitance of a polysilicon-insulator-polysilicon (PIP) structure, or the capacitance of a metal oxide semiconductor (MOS) structure. With this arrangement, the resistance to noise is improved, and a high-quality signal can be obtained.

When turned on by a reset signal RST, the reset transistor Tr3 causes draining of the electric charges retained in the memory portion MEM to a power-supply voltage VDD, to reset the potential of the memory portion MEM.

The amplification transistor Tr4 outputs a pixel signal corresponding to the potential of the memory portion MEM. Specifically, the amplification transistor Tr4 forms a source follower circuit with a load MOS (not shown) as a constant-current source, and a pixel signal indicating the level corresponding to the electric charges retained in the memory portion MEM is output from the amplification transistor Tr4 to the column signal processing circuit 5 (FIG. 1) via the selection transistor Tr5. The load MOS is disposed in the column signal processing circuit 5, for example.

The selection transistor Tr5 is turned on when the pixel 2 is selected by a selection signal SEL, and outputs the pixel signal of the pixel 2 to the column signal processing circuit 5 via the vertical signal line 9. When turned on by a drain signal PDRST, the drain transistor Tr6 drains the unnecessary electric charges stored in the photodiode PD to the power-supply voltage VDD. The transfer signals TRG1 and TRG2, the reset signal RST, the selection signal SEL, and the drain signal PDRST are controlled by the vertical drive circuit 4, and are supplied via the pixel drive line 10 (FIG. 1).

Operation of the pixel 2 is now briefly described.

First, before the exposure is started, a high-level drain signal PDRST is supplied to the drain transistor Tr6, to turn on the drain transistor Tr6. As a result, the electric charges stored in the photodiode PD are drained to the power-supply voltage VDD, and thus, the photodiode PD is reset.

After the photodiode PD is reset, the drain transistor Tr6 is turned off by a low-level drain signal PDRST, so that exposure is started in all the pixels.

Next, a high-level reset signal RST is supplied to the reset transistor Tr3. As a result, the electric charges retained in the memory portion MEM are drained to the power-supply voltage VDD, and thus, the potential of the memory portion MEM is reset.

After a predetermined exposure time has passed, the first transfer transistor Tr1 is turned on by a high-level transfer signal TRG1, and the second transfer transistor Tr2 is turned on by a high-level transfer signal TRG2 in all the pixels of the pixel array unit 3. As a result, the electric charges stored in the photodiode 21 are transferred to the memory portion MEM.

After the first transfer transistor Tr1 is turned off, the electric charges retained in the memory portion MEM of each pixel 2 are sequentially read out to the column signal processing circuits 5 row by row. In the read operation, the selection transistor Tr5 is turned on by a high-level selection signal SEL, so that the pixel signal indicating the level corresponding to the electric charges retained in the memory portion MEM is transmitted from the amplification transistor Tr4 to the column signal processing circuit 5 vis the selection transistor Tr5.

As described above, the circuit of the pixel 2 shown in FIG. 2 is a circuit that performs a global shutter operation (imaging) in which the same exposure time is set in all the pixels of the pixel array unit 3, and electric charges temporarily retained in the memory portions MEM after the end of the exposure are sequentially read from the memory portions MEM row by row.

As will be described later with reference to FIG. 3 and others, the solid-state imaging device 1 shown in FIG. 1 is formed by bonding two semiconductor substrates. The dashed line in FIG. 2 indicates the joining surfaces of the two semiconductor substrates.

3. Example Cross-Section Configuration of the First Embodiment

Figure 3:
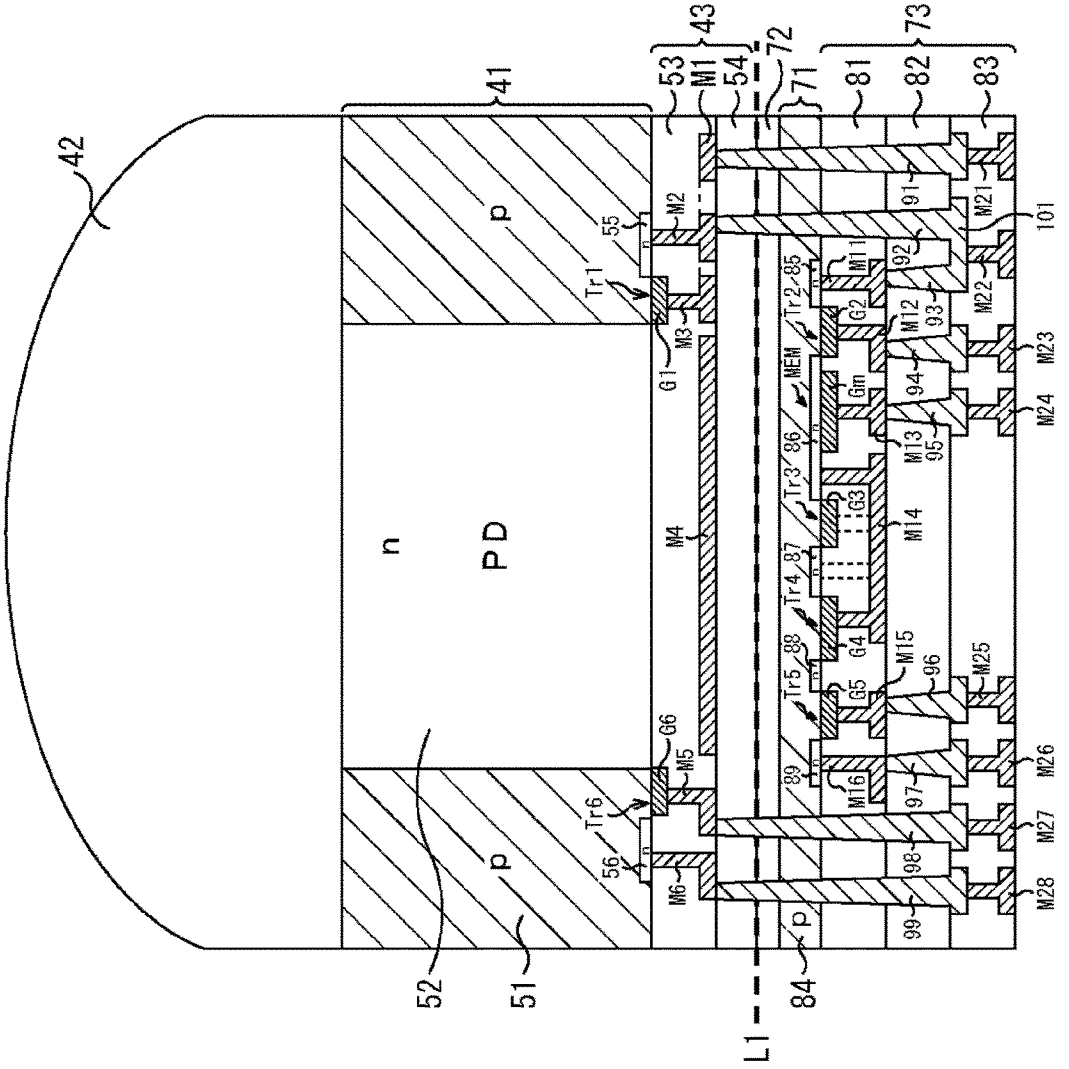
FIG. 3 is a cross-sectional view of a pixel according to the first embodiment.

FIG. 3 is a cross-sectional view of the pixel 2 according to the first embodiment shown in FIG. 2.

The circuit of the pixel 2 shown in FIG. 2 is formed by stacking a first semiconductor substrate 41 and a second semiconductor substrate 71, as shown in FIG. 3.

An on-chip lens 42 is formed for each pixel on the light incidence face side of the first semiconductor substrate 41, which is the upper side in FIG. 3, and a wiring layer 43 is formed on the opposite side of the first semiconductor substrate 41 from the light incidence face side. Note that, in addition to the on-chip lens 42, an inter-pixel light blocking film, a color filter, an antireflection film, a planarizing film, and the like may be further formed on the upper surface of the first semiconductor substrate 41 on the light incidence face side.

In the first semiconductor substrate 41, an n-type semiconductor region 52 is formed in a predetermined region within a p-type semiconductor region (p-well) 51, so that a photodiode PD is formed for each pixel.

The wiring layer 43 formed on the first semiconductor substrate 41 on the side of the second semiconductor substrate 71 includes insulating layers 53 and 54, and metallic wiring lines M1 through M6. The metallic wiring lines M1 through M3, M5, and M6 formed in the insulating layer 53 are wiring lines that transmit the transfer signal TRG1, the drain signal PDRST, the power-supply voltage VDD, a pixel signal, and the like, and the metallic wiring line M4 is a light blocking film designed to prevent incident light from entering the side of the second semiconductor substrate 71. As a light blocking film is formed with the metallic wiring line M4 at a position below the photodiode PD on the opposite side from the light incidence face side, it is possible to prevent incident light from leaking into the second semiconductor substrate 71.

The first transfer transistor Tr1 and the drain transistor Tr6 are formed in the interface under the first semiconductor substrate 41 adjacent to the photodiode PD. The first transfer transistor Tr1 includes a gate electrode G1 including polysilicon, and an n-type impurity region 55. The n-type impurity region 55 is a floating diffusion (FD) portion in an electrically floating state. The drain transistor Tr6 includes a gate electrode G6 including polysilicon, and an n-type impurity region 56. Note that, although not shown in the drawing, a gate insulating film is formed between the first semiconductor substrate 41 and the gate electrodes G1 and G6.

An insulating layer 72 is formed on the second semiconductor substrate 71 on the side of the first semiconductor substrate 41, and the insulating layer 54 of the first semiconductor substrate 41 and the insulating layer 72 of the second semiconductor substrate 71 are joined to each other by plasma bonding, for example. A dashed line L1 between the insulating layer 54 and the insulating layer 72 corresponds to the substrate junction plane shown in FIG. 2.

A multilayer wiring layer 73 including three insulating layers 81 through 83, metallic wiring lines M11 through M16, and metallic wiring lines M21 through M28 is formed on the surface of the second semiconductor substrate 71 on the opposite side from the first semiconductor substrate 41.

The second transfer transistor Tr2, the memory portion MEM, the reset transistor Tr3, the amplification transistor Tr4, and the selection transistor Tr5 are formed in the interface of the second semiconductor substrate 71 on the side of the multilayer wiring layer 73. Further, a p-type semiconductor region 84, and n-type semiconductor regions 85 through 89 that form, for example, the source/drain regions of the pixel transistors are formed in the second semiconductor substrate 71.

The second transfer transistor Tr2 includes a gate electrode G2 including polysilicon, and n-type impurity regions 85 and 86 as source/drain regions. The transfer signal TRG2 is applied to the gate electrode G2 of the second transfer transistor Tr2 via the metallic wiring line M12, a via wiring line 94, and the metallic wiring line M23. The n-type impurity region 85 of the second transfer transistor Tr2 is connected to the metallic wiring line M2 on the side of the first semiconductor substrate 41, via the metallic wiring line M11, a via wiring line 93, a connecting wiring line 101, and a through electrode 92.

The memory portion MEM includes an n-type impurity region 86 corresponding to the first electrode, and a second electrode Gm including polysilicon. The control potential TRG3 is applied to the second electrode Gm of the memory portion MEM via the metallic wiring line M13, a via wiring line 95, and the metallic wiring line M24.

The reset transistor Tr3 includes a gate electrode G3 including polysilicon, and n-type impurity regions 86 and 87 as source/drain regions. The n-type impurity region 86 as the source region of the reset transistor Tr3 is connected to a gate electrode G4 of the amplification transistor Tr4 via the metallic wiring line M14. The reset signal RST is applied to the gate electrode G3 of the reset transistor Tr3 at a location not shown in the drawing.

The amplification transistor Tr4 includes a gate electrode G4 including polysilicon, and n-type impurity regions 87 and 88 as source/drain regions. The gate electrode G4 is connected to the drain region of the second transfer transistor Tr2 and the n-type impurity region 86 as the source region of the reset transistor Tr3, via the metallic wiring line M14. The power-supply voltage VDD is applied to the n-type impurity region 87 as the drain region of the amplification transistor Tr4 and the drain region of the reset transistor Tr3, at a location not shown in the drawing.

The selection transistor Tr5 includes a gate electrode G5 including polysilicon, and n-type impurity regions 88 and 89 as source/drain regions. The selection signal SEL is applied to the gate electrode G5 of the selection transistor Tr5 via the metallic wiring line M15, a via wiring line 96, and the metallic wiring line M25. The n-type impurity region 89 as the source region of the selection transistor Tr5 is connected to the vertical signal line 9 via the metallic wiring line M16, a via wiring line 97, and the metallic wiring line M26.

The metallic wiring line M21 formed in the insulating layer 83 is connected to the metallic wiring line M1 of the wiring layer 43 of the first semiconductor substrate 41, via a through electrode 91. The metallic wiring line M1 is connected to the metallic wiring line M3 connected to the gate electrode G1 of the first transfer transistor Tr1 at a position not shown in the drawing, and the transfer signal TRG1 is supplied to the gate electrode G1 of the first transfer transistor Tr1 via the metallic wiring line M21, the through electrode 91, the metallic wiring line M1, and the metallic wiring line M3.

The metallic wiring line M27 formed in the insulating layer 83 is connected to the metallic wiring line M5 of the wiring layer 43 of the first semiconductor substrate 41, via a through electrode 98. The drain signal PDRST is supplied to the gate electrode G6 of the drain transistor Tr6 via the metallic wiring line M27, the through electrode 98, and the metallic wiring line M5.

The metallic wiring line M28 formed in the insulating layer 83 is connected to the metallic wiring line M6 of the wiring layer 43 of the first semiconductor substrate 41, via a through electrode 99. The power-supply voltage VDD is supplied to the n-type impurity region 56 via the metallic wiring line M28, the through electrode 99, and the metallic wiring line M6.

Note that, although not shown in the drawing, a gate insulating film is formed between the second semiconductor substrate 71, and the gate electrodes G2 through G5 and the second electrode Gm. An n-type impurity region for threshold voltage adjustment may be formed in the interface of the second semiconductor substrate 71 under the gate insulating film.

As shown in FIG. 3, the first semiconductor substrate 41 and the second semiconductor substrate 71 are electrically connected only by the four through electrodes 91, 92, 98, and 99 in the pixel region.

The material of the metallic wiring lines M1 through M6, the metallic wiring lines M11 through M16, and the metallic wiring lines M21 through M28 is tungsten (W), which is a refractory metallic wiring material, for example, but may be some other material such as aluminum (Al), copper (Cu), or gold (Au). The material of the through electrodes 91 and 92, the via wiring lines 93 through 97, and the through electrodes 98 and 99 is copper, for example, but some other metallic material may be used.

Meanwhile, the insulating layers 53 and 54 and the insulating layers 81 through 83 are formed with a SiO2 film, a low-k film (a low-dielectric-constant insulating film), a SiOC film, or the like, for example. The materials of the insulating layers 53 and 54 and the insulating layers 81 through 83 are not necessarily the same.

In the pixel 2 formed as described above, after a predetermined exposure time has passed, the first transfer transistor Tr1 is turned on by a high-level transfer signal TRG1, and the second transfer transistor Tr2 is turned on by a high-level transfer signal TRG2. As a result, the electric charges stored in the photodiode 21 are transferred to the n-type impurity region 86 of the memory portion MEM via the n-type impurity regions 55 and 85 that are FD portions. After that, in a read period of the pixel 2, the selection transistor Tr5 is turned on by a high-level selection signal SEL, and the electric charges stored in the n-type impurity region 86 of the memory portion MEM are transferred as a pixel signal, via the gate electrode G4 of the amplification transistor Tr4, and the selection transistor Tr5.

In the pixel structure according to the first embodiment shown in FIG. 3, the wiring layer 43 on the front surface side that is the wiring layer formation surface of the first semiconductor substrate 41, and the insulating layer 72 on the back surface side that is the opposite side from the wiring layer formation surface of the second semiconductor substrate 71 are joined to each other. At least the photodiode PD that photoelectrically converts incident light, and the first transfer transistor Tr1 that transfers electric charges of the photodiode PD are disposed in the first semiconductor substrate 41. At least the memory portion MEM as the charge retention portion that retains the electric charges transferred by the first transfer transistor Tr1, and the through electrode 92 that penetrates the second semiconductor substrate 71 and serves as a transmission path for transmitting the electric charges transferred from the first transfer transistor Tr1 to the memory portion MEM are disposed in the second semiconductor substrate 71.

Because the memory portion MEM as the charge retention portion that retains electric charges in a global shutter operation is formed in the second semiconductor substrate 71 different from the first semiconductor substrate 41 in which the photodiode PD that is a photoelectric conversion portion is formed, a sufficiently large photoelectric conversion region can be secured in the first semiconductor substrate 41. Furthermore, because the metallic wiring line M4 as a light blocking film is disposed in the wiring layer 43 between the first semiconductor substrate 41 and the second semiconductor substrate 71, it is possible to prevent incident light from leaking into the memory portion MEM, and enhance the PLS characteristics.

4. Manufacturing Method According to the First Embodiment

Referring now to FIGS. 4 through 7, a manufacturing method according to the first embodiment is described.

Figure 4:
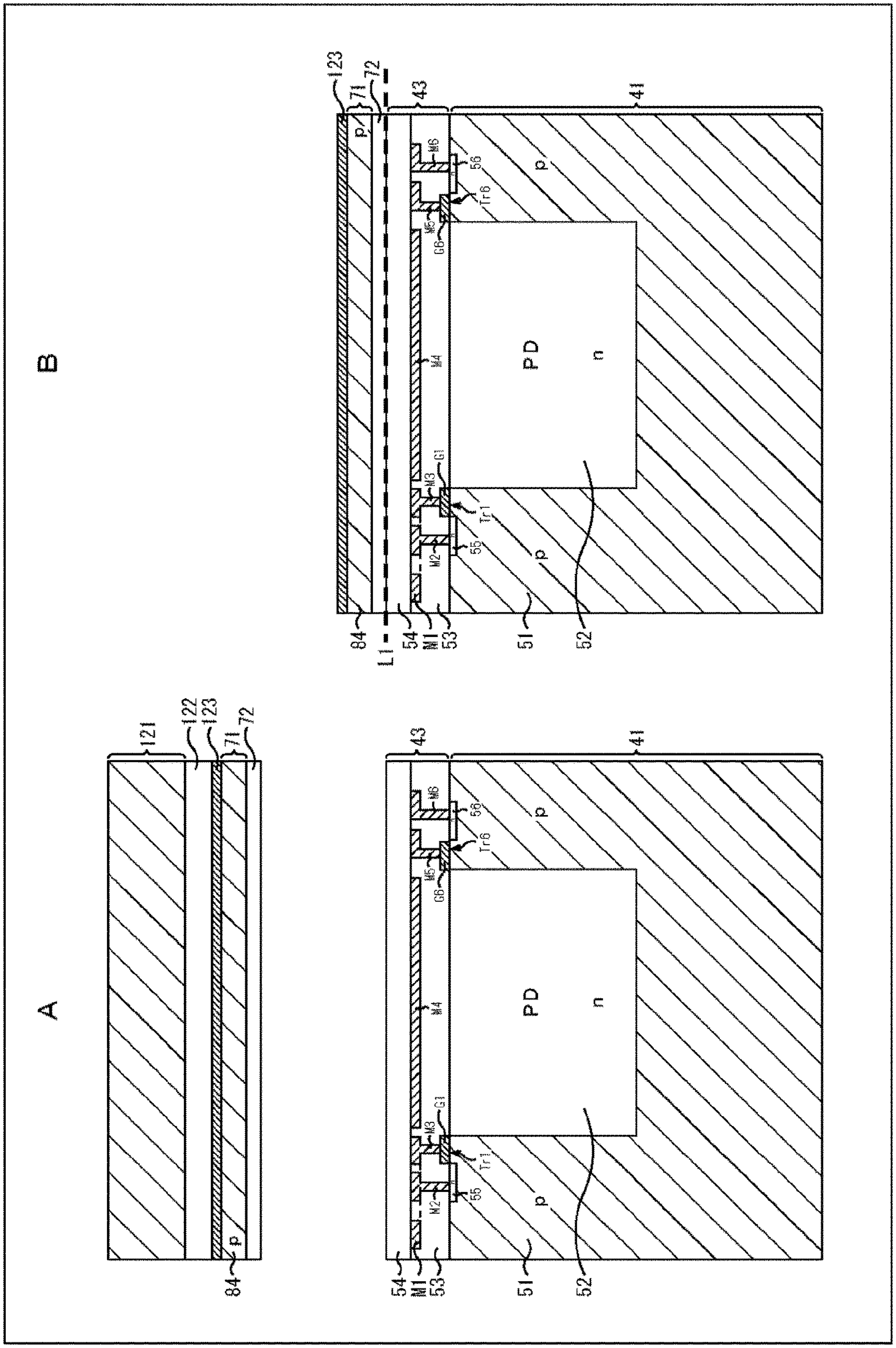
FIG. 4 is a diagram for explaining a manufacturing method according to the first embodiment.

First, as shown in A of FIG. 4, the photodiode PD, the first semiconductor substrate 41 on which the wiring layer 43 including the first transfer transistor Tr1, the drain transistor Tr6, and the like is formed, and the second semiconductor substrate 71 temporarily bonded to a support substrate 121 are prepared. The first semiconductor substrate 41 in A of FIG. 4 is in a state before having its thickness reduced to the thickness shown in FIG. 3. The insulating layer 72 is formed on one surface of the second semiconductor substrate 71, and polysilicon 123 is formed on the entire other surface of the second semiconductor substrate 71. The support substrate 121 is temporarily bonded to the surface of the second semiconductor substrate 71 on which the polysilicon 123 is formed, via an insulating layer 122.

As shown in B of FIG. 4, the wiring layer 43 of the first semiconductor substrate 41 and the insulating layer 72 of the second semiconductor substrate 71 are joined to each other by plasma bonding, for example, and the support substrate 121 temporarily bonded to the second semiconductor substrate 71 is then peeled off. After the support substrate 121 is peeled off, the polysilicon 123 formed on an entire surface of the second semiconductor substrate 71 is exposed. The surface on which the polysilicon 123 is formed is the front surface of the second semiconductor substrate 71.

In the plasma bonding, a film such as a plasma TEOS film, a plasma SiN film, a SiON film (a block film), or a SiC film is formed on each of the joining surfaces of the first semiconductor substrate 41 and the second semiconductor substrate 71, and the joining surfaces are brought into contact with each other through a plasma treatment. After that, an annealing treatment is performed, to join the two joining surfaces to each other. Instead of the plasma bonding, bonding may be performed with an adhesive.

Figure 5:
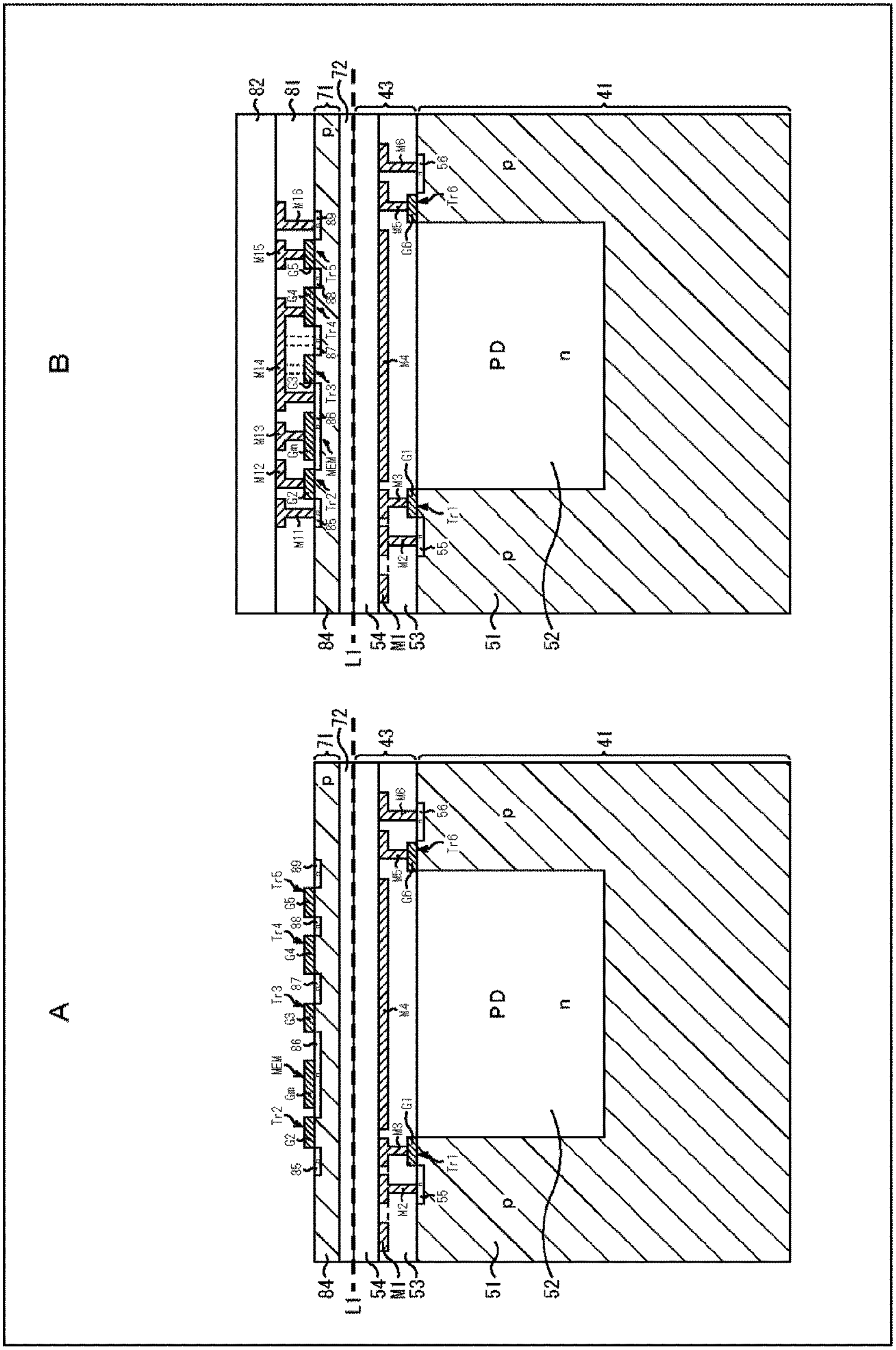
FIG. 5 is a diagram for explaining the manufacturing method according to the first embodiment.

Next, as shown in A of FIG. 5, ions of an n-type impurity such as phosphorus (P) or arsenic (As) are injected into a predetermined region in the vicinity of the front surface of the second semiconductor substrate 71 of the p-type, for example, so that the n-type impurity regions 85 through 89 are formed. Also, patterning is performed on the polysilicon 123, so that the second transfer transistor Tr2, the memory portion MEM, the reset transistor Tr3, the amplification transistor Tr4, and the selection transistor Tr5 are formed.

Next, as shown in B of FIG. 5, the insulating layer 81, the metallic wiring lines M11 through M16, and the insulating layer 82 are formed on the upper surface of the second semiconductor substrate 71 in which pixel transistors such as the second transfer transistor Tr2 are formed. The material of the metallic wiring lines M11 through M16 formed in the insulating layer 81 is tungsten, for example.

Figure 6:
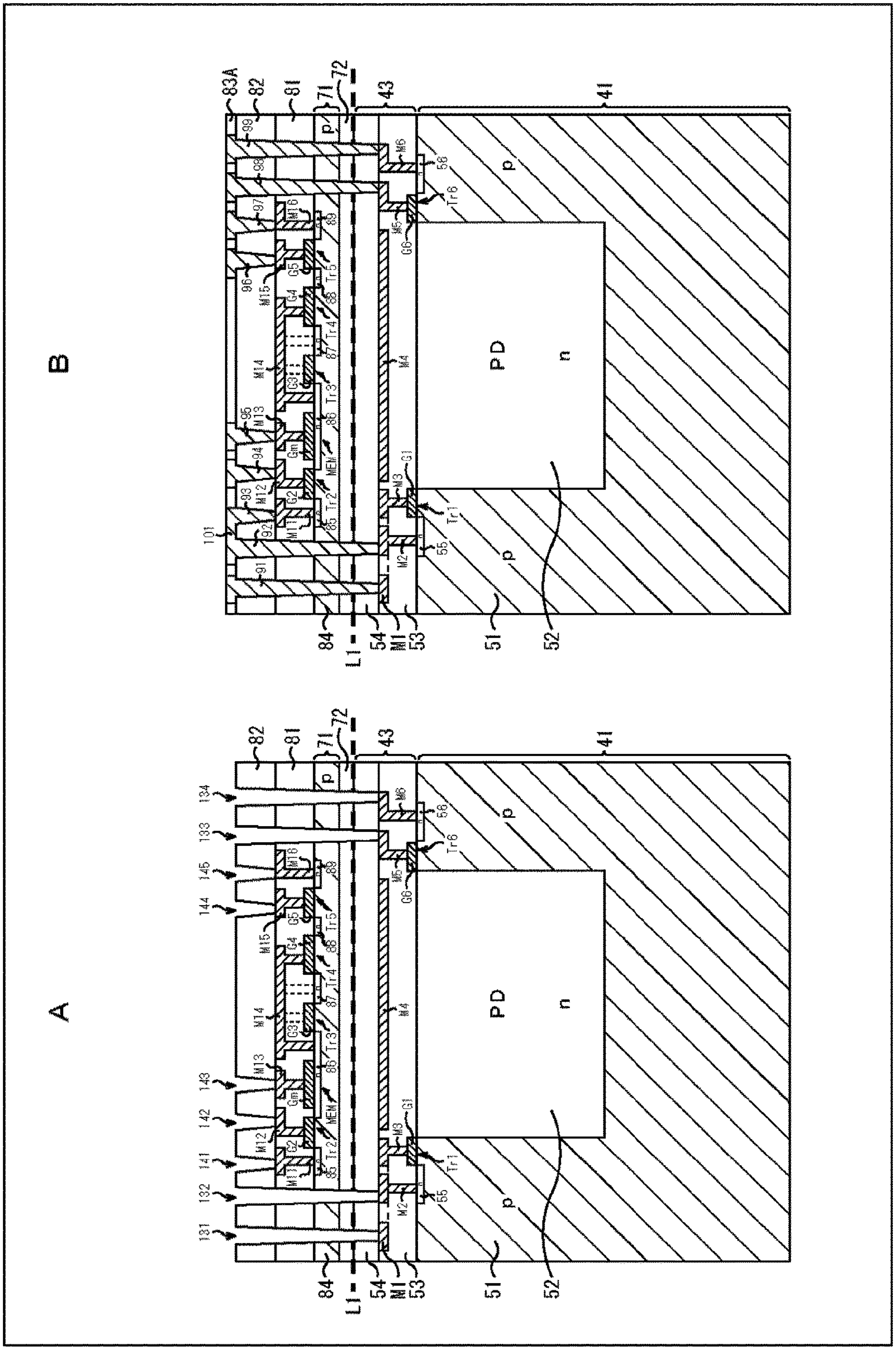
FIG. 6 is a diagram for explaining the manufacturing method according to the first embodiment.

Next, as shown in A of FIG. 6, through connecting holes 131 through 134 penetrating the second semiconductor substrate 71 to reach the metallic wiring line M1, M2, M5, or M6 of the first semiconductor substrate 41, and connecting holes 141 through 145 reaching the metallic wiring line M11, M12, M13, M15, or M16 formed in the insulating layer 81 are formed by dry etching or the like. The opening sizes of the through connecting holes 131 through 134 and the connecting holes 141 through 145 are tapered so as to be the largest in the uppermost surface, and be the smallest in the deepest portion that is the bottom surface. The cross-sectional diameters of the through connecting holes 131 through 134 in the junction plane L1 are smaller than or the same as the cross-sectional diameters of the portions penetrating the second semiconductor substrate 71. Further, comparisons between the opening sizes of the through connecting holes 131 through 134 and the opening sizes of the connecting holes 141 through 145 show that the opening sizes of the through connecting holes 131 through 134 penetrating the second semiconductor substrate 71 are the larger.

Next, as shown in B of FIG. 6, an insulating layer 83A that is part of the insulating layer 83 is formed, and copper (Cu) as a connecting conductor is buried in the through connecting holes 131 through 134 and the connecting holes 141 through 145 formed in the step illustrated in A of FIG. 6, and in a predetermined region of the insulating layer 83A on the through connecting holes 131 through 134 and the connecting holes 141 through 145, so that the through electrodes 91 and 92, the via wiring lines 93 through 97, the through electrodes 98 and 99, the connecting wiring line 101 in the same layer as the insulating layer 83A, and the like are formed. Note that the connecting conductors buried in the through connecting holes 131 through 134 and the connecting holes 141 through 145 may be tungsten (W), polysilicon, or the like, instead of copper. Further, before burying the connecting conductor, an insulating film for insulating the connecting conductor from the second semiconductor substrate 71 is formed on the inner wall surfaces of the through connecting holes 131 through 134.

Figure 7:
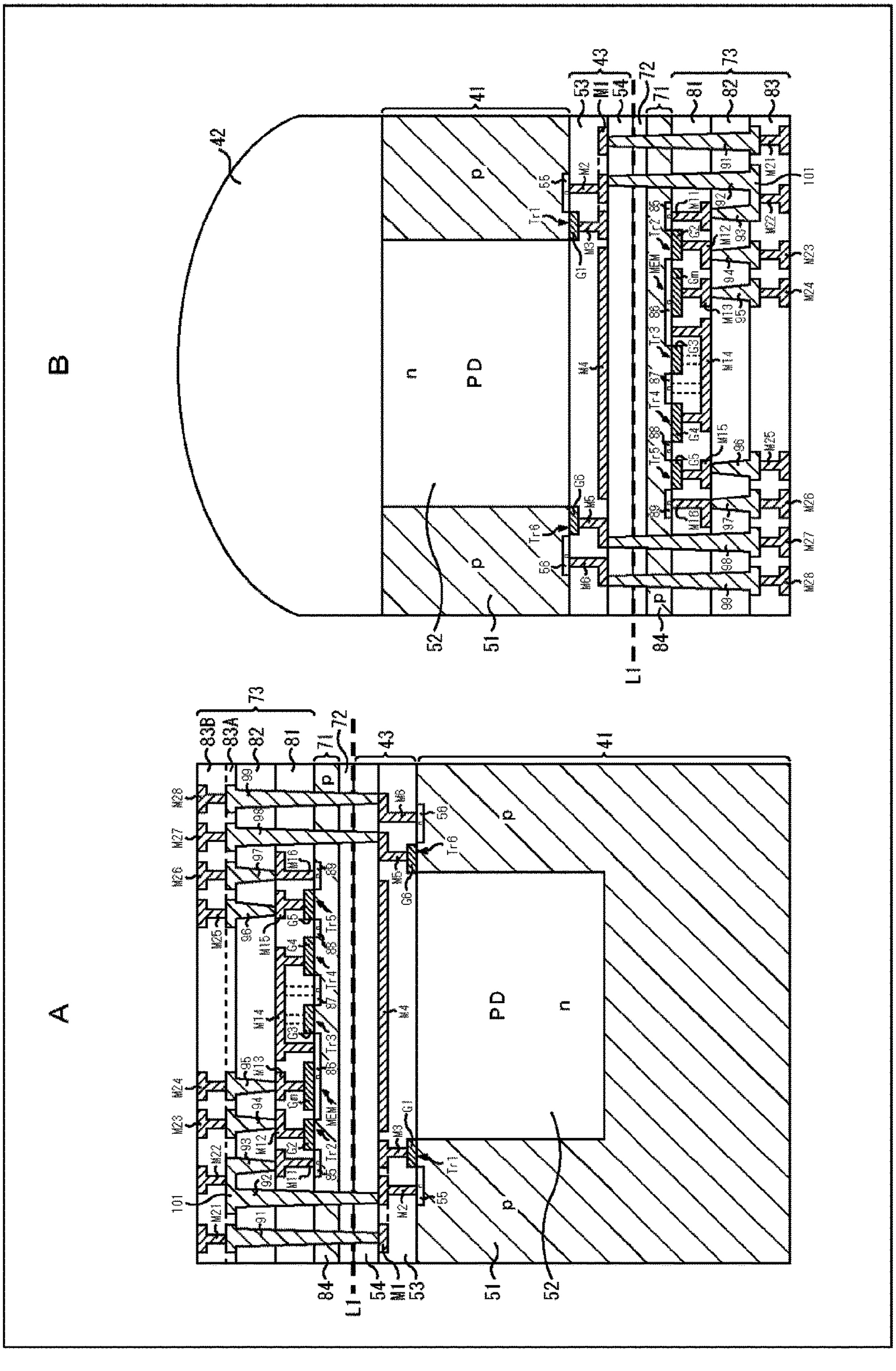
FIG. 7 is a diagram for explaining the manufacturing method according to the first embodiment.

Next, as shown in A of FIG. 7, an insulating layer 83B and the metallic wiring lines M21 through M28 are formed on the upper surface of the insulating layer 83A, so that the multilayer wiring layer 73 is completed. The insulating layers 83A and 83B correspond to the insulating layer 83 shown in FIG. 3. The material of the metallic wiring lines M21 through M28 formed in the insulating layer 83B is tungsten, for example.

After the multilayer wiring layer 73 is formed, the first semiconductor substrate 41 and the second semiconductor substrate 71 joined to each other are collectively reversed. As shown in B of FIG. 7, the thickness of the first semiconductor substrate 41 is then reduced so that the photodiode PD is located closer to the interface, and the on-chip lens 42 is formed. Thus, the state shown in FIG. 3 is created.

As described above, it is possible to manufacture the pixel structure shown in FIG. 3 by: forming the photodiode PD that photoelectrically converts incident light and the first transfer transistor Tr1 that transfers the electric charges of the photodiode PD in the first semiconductor substrate 41; bonding the front surface side, which is the wiring layer formation surface of the first semiconductor substrate 41, to the back surface side, which is the opposite side from the wiring layer formation surface of the second semiconductor substrate 71; forming the memory portion MEM that retains the electric charges transferred by the first transfer transistor Tr1 in the bonded second semiconductor substrate 71; and forming the through electrode 92 that penetrates the second semiconductor substrate 71, and transmits the electric charges transferred from the first transfer transistor Tr1 to the memory portion MEM.

According to the manufacturing method described above, as shown in A of FIG. 8, after the wiring layer 43 of the first semiconductor substrate 41 and the insulating layer 72 of the second semiconductor substrate 71 are joined to each other by plasma bonding, for example, the second transfer transistor Tr2, the memory portion MEM, the reset transistor Tr3, the amplification transistor Tr4, and the selection transistor Tr5 are formed on the upper surface (front surface) of the second semiconductor substrate 71.

The formation of the n-type impurity regions 85 through 89 in the second semiconductor substrate 71 and the patterning of the polysilicon 123 are performed through high-precision position control, with the reference being the alignment mark formed in the bonded first semiconductor substrate 41. Thus, the positional deviation from the position designed for an element formed in the first semiconductor substrate 41 can be restricted to 0.1 μm or less with precision.

Figure 8:
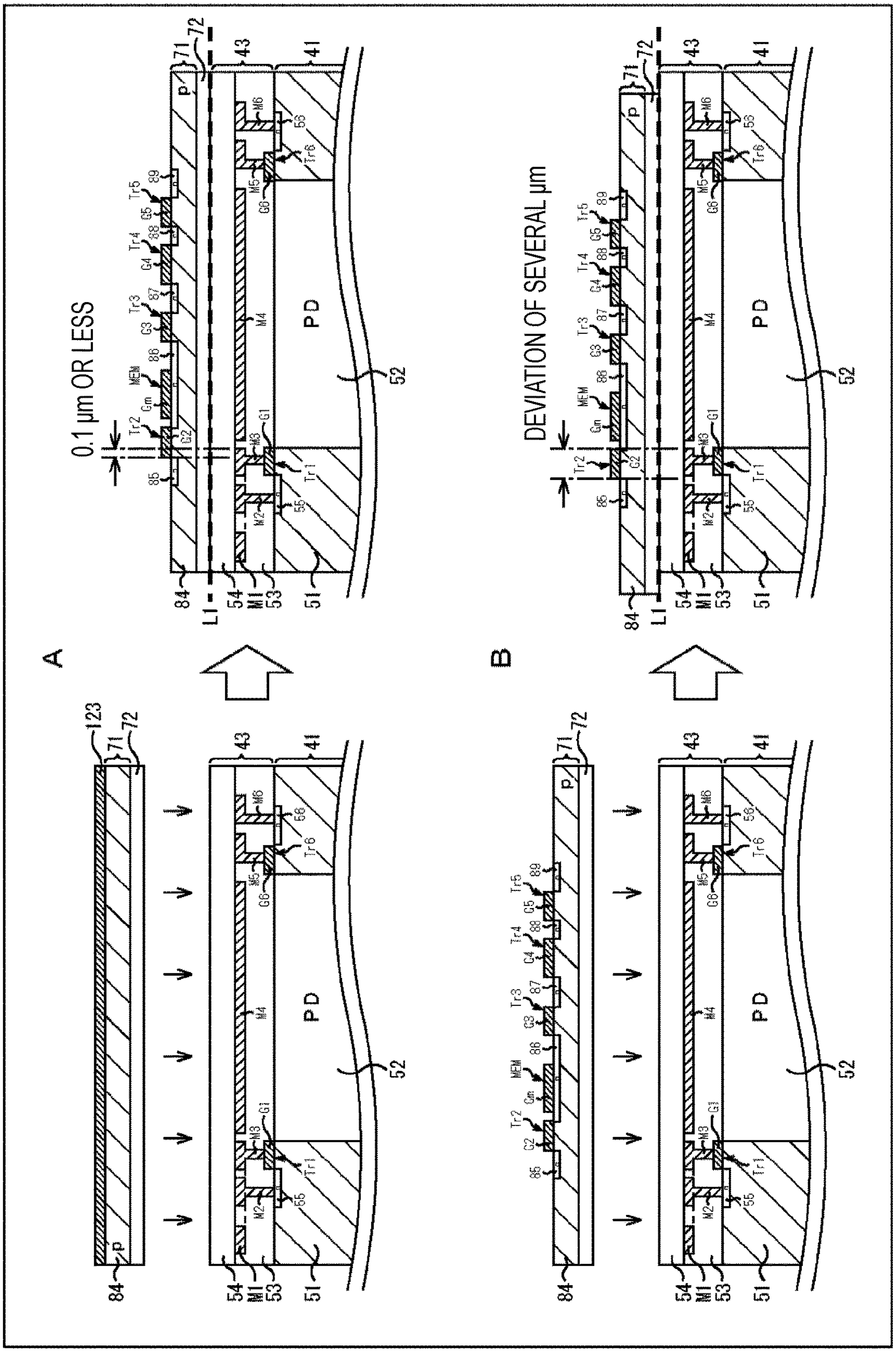
FIG. 8 is a diagram for explaining the effects of the manufacturing method according to the first embodiment.

On the other hand, in a case where the first semiconductor substrate 41 and the second semiconductor substrate 71 are bonded to each other after the pixel transistors are formed in the second semiconductor substrate 71, as shown in B of FIG. 8, there is a deviation of several μm from the designed position, for example.

Therefore, with the pixel structure and the manufacturing method described above, there is no need to secure the tolerance assumed on the basis of the variation in the bonding position of the first semiconductor substrate 41 and the second semiconductor substrate 71, and thus, the elements can be miniaturized. In other words, with the pixel structure and the manufacturing method according to the present technology, it is possible to provide a pixel structure and a manufacturing method that are compatible with miniaturization of pixels.

5. Example Pixel Circuit Configuration of a Second Embodiment

Figure 9:
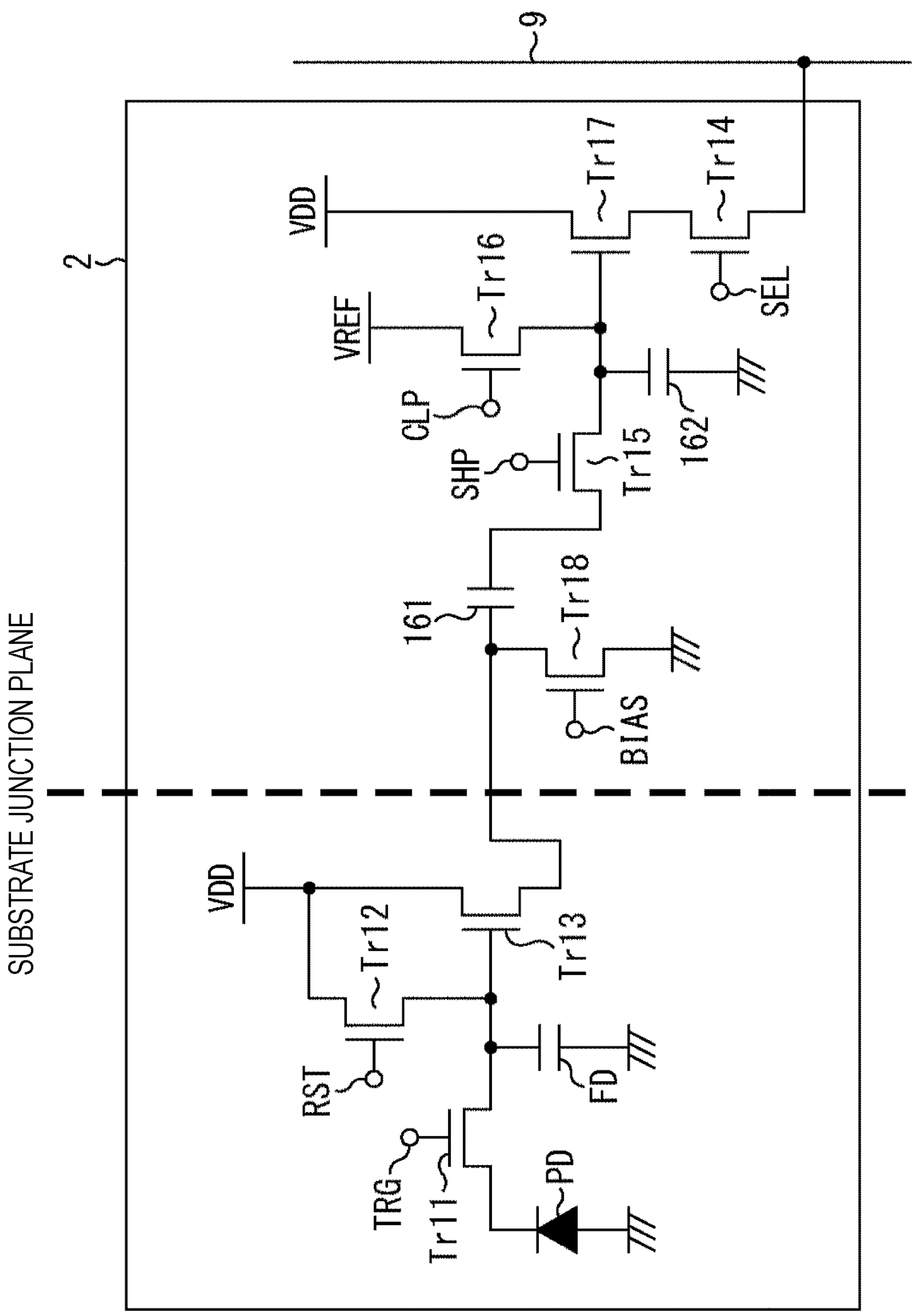
FIG. 9 is a diagram showing an example circuit configuration of a pixel according to a second embodiment.

FIG. 9 shows an example circuit configuration of a second embodiment of each pixel 2 shown in FIG. 1.

A pixel 2 includes a photodiode PD as a photoelectric conversion element, a transfer transistor Tr11, a reset transistor Tr12, a first amplification transistor Tr13, a selection transistor Tr14, a sample-and-hold transistor Tr15, a clamp transistor Tr16, a second amplification transistor Tr17, a load transistor Tr18, a first charge retention portion 161, and a second charge retention portion 162.

A dashed line in FIG. 9 indicates the junction plane between two semiconductor substrates, as in the first embodiment.

The photodiode PD is a photoelectric conversion portion that generates and stores electric charges (signal charges) depending on the amount of received light. The transfer transistor Tr11 transfers a photoelectric conversion signal stored in the photodiode PD to the gate terminal of the first amplification transistor Tr13, in accordance with a transfer signal TRG. At this point of time, the photoelectric conversion signal transferred by the transfer transistor Tr11 is stored into a node capacitance FD. The node capacitance FD is a capacitance accompanying a node connected to the gate terminal of the first amplification transistor Tr13.

The first amplification transistor Tr13 is a charge-voltage conversion portion that converts the electric charges stored in the node capacitance FD into a signal voltage, and outputs the converted signal voltage to the first charge retention portion 161.

The reset transistor Tr12 resets the photoelectric conversion signal in the pixel to a power-supply voltage VDD, in accordance with a reset signal RST.

The load transistor Tr18 operates as a load of the first amplification transistor Tr13 that outputs a signal voltage, in accordance with a bias signal BIAS. The load transistor Tr18 supplies the first amplification transistor Tr13 with a current for driving the first amplification transistor Tr13 that outputs a signal voltage.

The first charge retention portion 161 is a capacitor that retains (stores) the signal voltage output from the first amplification transistor Tr13. The clamp transistor Tr16 clamps the first charge retention portion 161 and the second charge retention portion 162 at a fixed potential VREF, in accordance with a clamp signal CLP. As a result, the first charge retention portion 161 and the second charge retention portion 162 retain the clamped fixed potential VREF.

The sample-and-hold transistor Tr15 causes the second charge retention portion 162 to hold a signal, in accordance with a control signal SHP. The second charge retention portion 162 is a capacitor that retains (stores) a signal voltage (a signal from which noise components have been removed in the pixel) that has been input via the sample-and-hold transistor Tr15.

In the pixel 2 of the second embodiment, a denoising process for removing noise components derived from leakage current (dark current) is performed with a configuration formed with the load transistor Tr18, the sample-and-hold transistor Tr15, the clamp transistor Tr16, the first charge retention portion 161, and the second charge retention portion 162. The second charge retention portion 162 then retains (stores) the signal subjected to the denoising process.

Note that, as the first charge retention portion 161 and the second charge retention portion 162, it is preferable to use a capacitance of an MIM structure that is a capacitor with a small leakage current (dark current) per unit area, a capacitance of a PIP structure, or a capacitance of a MOS structure. With this arrangement, the resistance to noise is improved, and a high-quality signal can be obtained.

The second amplification transistor Tr17 outputs a voltage of the gate terminal, which is a signal voltage corresponding to the noise-removed signal stored in the second charge retention portion 162.

The selection transistor Tr14 outputs the signal voltage output from the second amplification transistor Tr17, as the pixel signal to be output by the pixel 2, to a vertical signal line 9, in accordance with a selection signal SEL. As a result, the pixel signal corresponding to the photoelectric conversion signal of the photodiode PD is read out to the vertical signal line 9.

6. Example Cross-Section Configuration of the Second Embodiment

Figure 10:
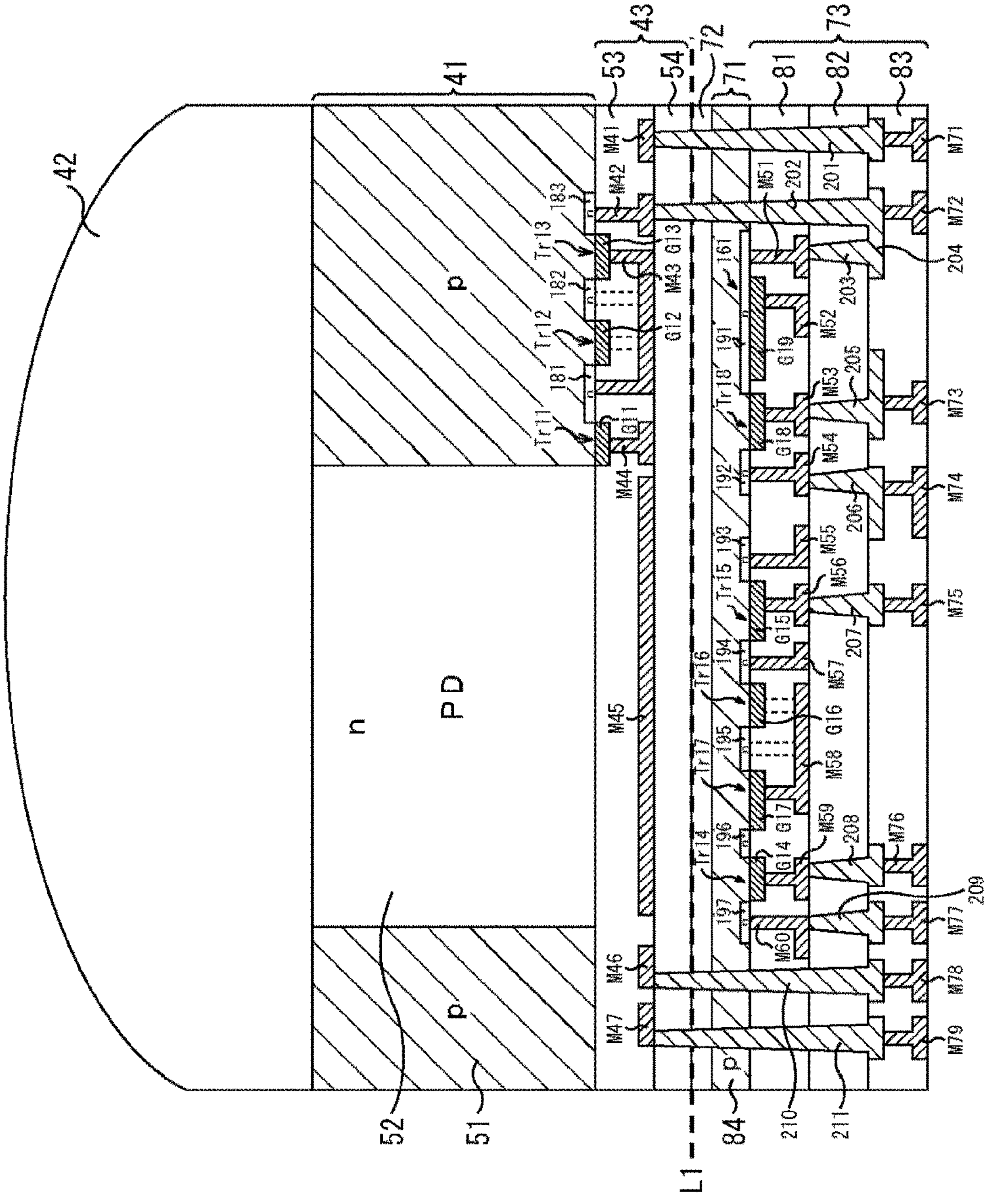
FIG. 10 is a cross-sectional view of a pixel according to the second embodiment.

FIG. 10 is a cross-sectional view of the pixel 2 according to the second embodiment shown in FIG. 9.

The circuit of the pixel 2 according to the second embodiment is configured by joining the first semiconductor substrate 41 and the second semiconductor substrate 71 to each other, as in the first embodiment.

An on-chip lens 42 is formed for each pixel on the light incidence face side of the first semiconductor substrate 41, which is the upper side in FIG. 10, and a wiring layer 43 is formed on the opposite side of the first semiconductor substrate 41 from the light incidence face side. Note that, in addition to the on-chip lens 42, an inter-pixel light blocking film, a color filter, an antireflection film, a planarizing film, and the like may be further formed on the upper surface of the first semiconductor substrate 41 on the light incidence face side.

In the first semiconductor substrate 41, an n-type semiconductor region 52 is formed in a predetermined region within a p-type semiconductor region (p-well) 51, so that a photodiode PD is formed for each pixel.

The wiring layer 43 formed on the first semiconductor substrate 41 on the side of the second semiconductor substrate 71 includes insulating layers 53 and 54, and metallic wiring lines M41 through 47. The metallic wiring lines M41 through M44, M46, and M47 formed in the insulating layer 53 are wiring lines that transmit the transfer signal TRG, the reset signal RST, the power-supply voltage VDD, a pixel signal, and the like, and the metallic wiring line M45 is a light blocking film designed to prevent incident light from entering the side of the second semiconductor substrate 71. As a light blocking film is formed with the metallic wiring line M45 at a position below the photodiode PD on the opposite side from the light incidence face side, it is possible to prevent incident light from leaking into the second semiconductor substrate 71.

The transfer transistor Tr11, the reset transistor Tr12, and the first amplification transistor Tr13 are formed in the interface under the first semiconductor substrate 41 adjacent to the photodiode PD. The transfer transistor Tr11 includes a gate electrode G11 including polysilicon, and an n-type impurity region 181. The reset transistor Tr12 includes a gate electrode G12 including polysilicon, and n-type impurity regions 181 and 182 as source/drain regions. The first amplification transistor Tr13 includes a gate electrode G13 including polysilicon, and n-type impurity regions 182 and 183 as source/drain regions. The gate electrode G13 of the first amplification transistor Tr13 is connected to the drain region (FD portion) of the transfer transistor Tr11 and the n-type impurity region 181 as the source region of the reset transistor Tr12, via the metallic wiring line M43. Note that, although not shown in the drawing, a gate insulating film is formed between the first semiconductor substrate 41 and the gate electrodes G11, G12, and G13.

An insulating layer 72 is formed on the second semiconductor substrate 71 on the side of the first semiconductor substrate 41, and the insulating layer 54 of the first semiconductor substrate 41 and the insulating layer 72 of the second semiconductor substrate 71 are joined to each other by plasma bonding, for example. A dashed line L1 between the insulating layer 54 and the insulating layer 72 corresponds to the substrate junction plane shown in FIG. 9.

A multilayer wiring layer 73 including three insulating layers 81 through 83, metallic wiring lines M51 through M60, and metallic wiring lines M71 through M79 is formed on the surface of the second semiconductor substrate 71 on the opposite side from the first semiconductor substrate 41.

The first charge retention portion 161, the load transistor Tr18, the sample-and-hold transistor Tr15, the clamp transistor Tr16, the second amplification transistor Tr17, and the selection transistor Tr14 are formed in the interface of the second semiconductor substrate 71 on the side of the multilayer wiring layer 73. Further, a p-type semiconductor region 84, and n-type semiconductor regions 191 through 197 that form, for example, the source/drain regions of the pixel transistors are formed in the second semiconductor substrate 71.

The first charge retention portion 161 includes the n-type impurity region 191 corresponding to the first electrode, and a second electrode G19 including polysilicon. The n-type impurity region 191 of the first charge retention portion 161 is connected to the n-type impurity region 183 serving as the source region of the first amplification transistor Tr13, via the metallic wiring line M51, a via wiring line 203, a connecting wiring line 204, a through electrode 202, and the metallic wiring line M42. With this arrangement, the photoelectric conversion signal stored in the photodiode PD is transmitted from the side of the first semiconductor substrate 41 to the side of the second semiconductor substrate 71 via the through electrode 202, and is stored into the first charge retention portion 161.

The load transistor Tr18 includes a gate electrode G18 including polysilicon, and n-type impurity regions 191 and 192 as source/drain regions. The bias signal BIAS is applied to the gate electrode G18 of the load transistor Tr18, via the metallic wiring line M53, a via wiring line 205, and the metallic wiring line M73. A GND voltage is applied to the n-type impurity region 192 as the source region of the load transistor Tr18, via the metallic wiring line M54, a via wiring line 206, and the metallic wiring line M74.

The sample-and-hold transistor Tr15 includes a gate electrode G15 including polysilicon, and n-type impurity regions 193 and 194 as source/drain regions. The control signal SHP is applied to the gate electrode G15 of the sample-and-hold transistor Tr15, via the metallic wiring line M56, a via wiring line 207, and the metallic wiring line M75.

The clamp transistor Tr16 includes a gate electrode G16 including polysilicon, and n-type impurity regions 194 and 195 as source/drain regions. The clamp signal CLP is applied to the gate electrode G16 of the clamp transistor Tr16 at a location not shown in the drawing.

The second amplification transistor Tr17 includes a gate electrode G17 including polysilicon, and n-type impurity regions 195 and 196 as source/drain regions. The gate electrode G17 of the second amplification transistor Tr17 is connected to the source region of the clamp transistor Tr16, the drain region of the sample-and-hold transistor Tr15, and one end of the second charge retention portion 162, at a position not shown in the drawing.

The selection transistor Tr14 includes a gate electrode G14 including polysilicon, and n-type impurity regions 196 and 197 as source/drain regions. The selection signal SEL is applied to the gate electrode G14 of the selection transistor Tr14, via the metallic wiring line M59, a via wiring line 208, and the metallic wiring line M76. The n-type impurity region 197 as the drain region of the selection transistor Tr14 is connected to the vertical signal line 9, via the metallic wiring line M60, a via wiring line 209, and the metallic wiring line M77.

The metallic wiring line M71 formed in the insulating layer 83 is connected to the metallic wiring line M41 of the wiring layer 43 of the first semiconductor substrate 41, via a through electrode 201. The through electrode 201 supplies the power-supply voltage VDD from the side of the second semiconductor substrate 71 to the side of the first semiconductor substrate 41.

The metallic wiring line M78 formed in the insulating layer 83 is connected to the metallic wiring line M46 of the wiring layer 43 of the first semiconductor substrate 41, via a through electrode 210. The through electrode 210 transmits the reset signal RST from the side of the second semiconductor substrate 71 to the side of the first semiconductor substrate 41.

The metallic wiring line M79 formed in the insulating layer 83 is connected to the metallic wiring line M47 of the wiring layer 43 of the first semiconductor substrate 41, via a through electrode 211. The through electrode 211 transmits the transfer signal TRG from the side of the second semiconductor substrate 71 to the side of the first semiconductor substrate 41.

Note that, although not shown in the drawing, a gate insulating film is formed between the second semiconductor substrate 71, and the gate electrodes G14 through G18 and the second electrode G19. An n-type impurity region for threshold voltage adjustment may be formed in the interface of the second semiconductor substrate 71 under the gate insulating film.

The material of the metallic wiring lines M41 through M47, the metallic wiring lines M51 through M60, and the metallic wiring lines M71 through M79 is tungsten (W), which is a refractory metallic wiring material, for example, but may be some other material such as aluminum (Al), copper (Cu), or gold (Au). Copper is used as the material of the through electrodes 201 and 202, the via wiring lines 203 and 205 through 209, the through electrodes 210 and 211, and the connecting wiring line 204, for example, but some other metallic material may be used instead.

In the pixel structure according to the second embodiment shown in FIG. 10, the wiring layer 43 on the front surface side that is the wiring layer formation surface of the first semiconductor substrate 41, and the insulating layer 72 on the back surface side that is the opposite side from the wiring layer formation surface of the second semiconductor substrate 71 are joined to each other. At least the photodiode PD that photoelectrically converts incident light, the transfer transistor Tr11 that transfers electric charges of the photodiode PD, and the like are disposed in the first semiconductor substrate 41. At least the first charge retention portion 161 as a charge/voltage retention portion that retains the voltage corresponding to the electric charges transferred by the transfer transistor Tr11, and the through electrode 202 that penetrates the second semiconductor substrate 71 and serves as a transmission path for transmitting the electric charges transferred from the transfer transistor Tr11 to the first charge retention portion 161 are disposed in the second semiconductor substrate 71.

Because the first charge retention portion 161 as the charge/voltage retention portion that retains a voltage corresponding to electric charges in a global shutter operation is formed in the second semiconductor substrate 71 different from the first semiconductor substrate 41 in which the photodiode PD that is a photoelectric conversion portion is formed, a sufficiently large photoelectric conversion region can be secured in the first semiconductor substrate 41. Furthermore, because the metallic wiring line M45 as a light blocking film is disposed in the wiring layer 43 between the first semiconductor substrate 41 and the second semiconductor substrate 71, it is possible to prevent incident light from leaking into the first charge retention portion 161, and enhance the PLS characteristics.

7. Example Cross-Section Configuration of a Three-Layer Stack Structure

The first and second embodiments described above are examples in which two semiconductor substrates are joined to each other to form the solid-state imaging device 1. However, as shown in FIGS. 11 and 12, it is possible to form configurations in which three semiconductor substrates are stacked.

Figure 11:
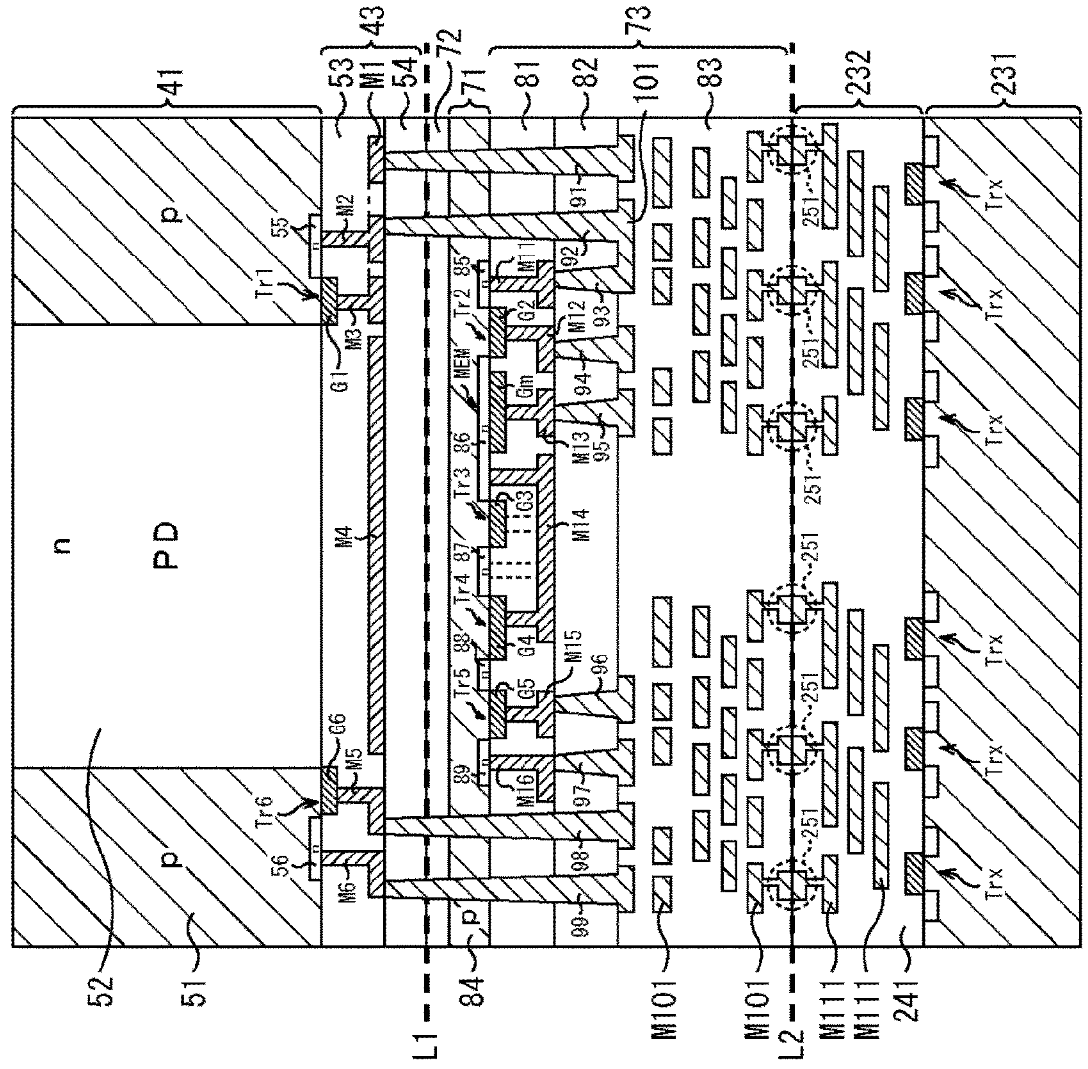
FIG. 11 is a cross-sectional view of a first configuration in which three semiconductor substrates are stacked.

FIG. 11 is a cross-sectional view of a first configuration in which three semiconductor substrates are stacked.

Figure 12:
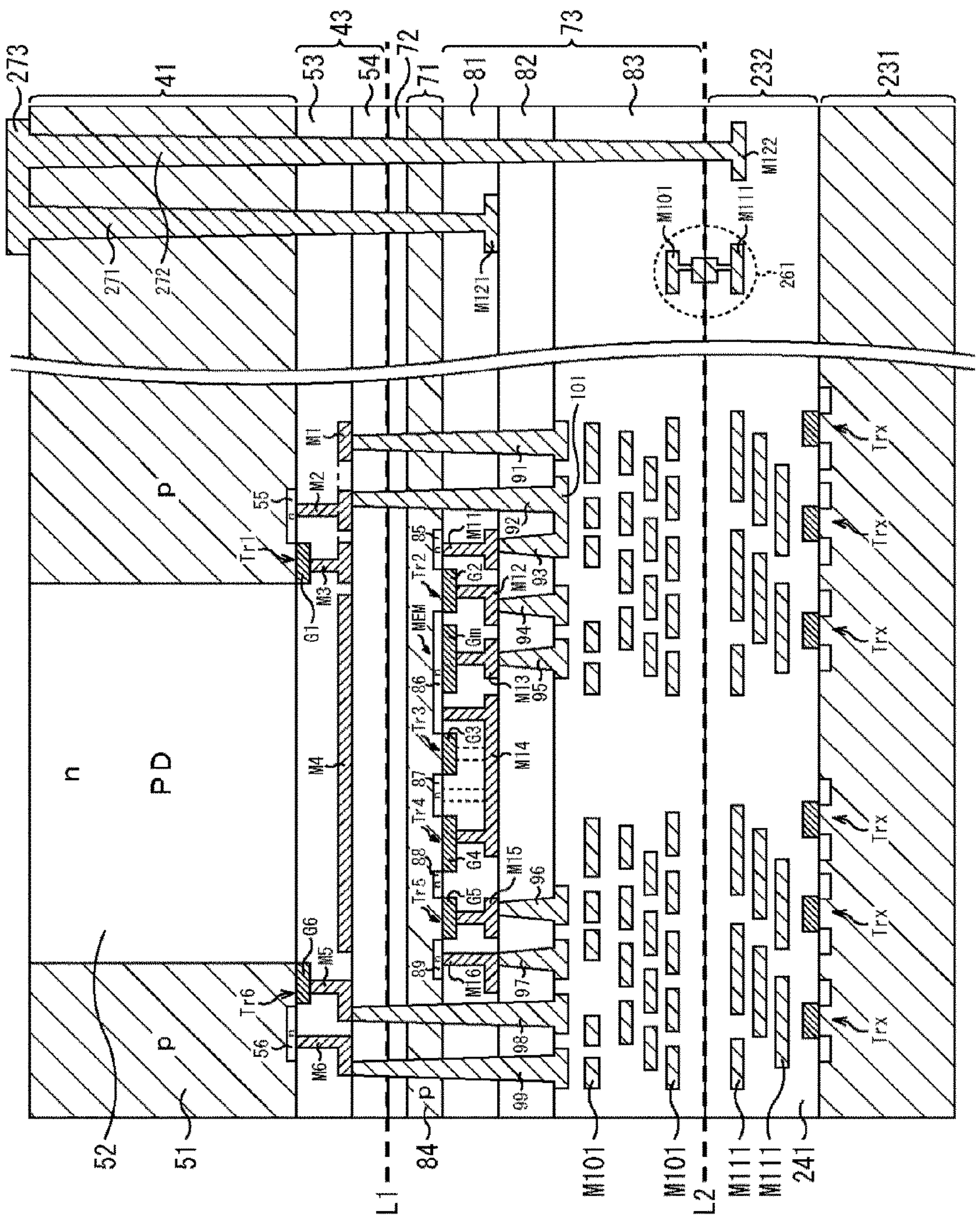
FIG. 12 is a cross-sectional view of a second configuration in which three semiconductor substrates are stacked.

Note that FIGS. 11 and 12 each show a configuration in a case where the pixel configuration according to the first embodiment shown in FIG. 3 has a three-layer structure. The portions corresponding to those shown in FIG. 3 are denoted by the same reference numerals as those in FIG. 3, and explanation of them will not be repeated. Meanwhile, the on-chip lens 42 is not shown due to limitations of space.

In the cross-sectional view of the first configuration in FIG. 11, a third semiconductor substrate 231 is stacked, in addition to the first semiconductor substrate 41 and the second semiconductor substrate 71.

In the insulating layer 83 closest to the third semiconductor substrate 231 in the multilayer wiring layer 73 formed on the second semiconductor substrate 71, layers of metallic wiring lines M101 are stacked.

On the upper surface of the third semiconductor substrate 231, which is the upper side in FIG. 11, a multilayer wiring layer 232 including layers of metallic wiring lines M111 and an interlayer insulating film 241 is formed. A plurality of transistors Trx is formed at the interface between the third semiconductor substrate 231 and the multilayer wiring layer 232.

The multilayer wiring layer 73 of the second semiconductor substrate 71 and the multilayer wiring layer 232 of the third semiconductor substrate 231 are joined to each other at the junction plane L2. The multilayer wiring layer 73 and the multilayer wiring layer 232 are electrically connected, as some of the metallic wiring lines M101 and some of the metallic wiring lines M111 are connected by Cu—Cu metal joining in a plurality of predetermined regions 251.

A logic circuit that performs predetermined signal processing is formed in the plurality of transistors Trx and the multilayer wiring layer 232 formed on the third semiconductor substrate 231, and corresponds to the output circuit 7 in FIG. 1, for example.

FIG. 12 is a cross-sectional view of a second configuration in which three semiconductor substrates are stacked. In FIG. 12, the components corresponding to those shown in FIG. 11 are denoted by the same reference numerals as those used in FIG. 11, and explanation of them will not be repeated below.

In the cross-sectional view of the second configuration in FIG. 12, the multilayer wiring layer 73 of the second semiconductor substrate 71 and the multilayer wiring layer 232 of the third semiconductor substrate 231 are electrically connected by a twin-contact structure and Cu—Cu metal joining, not in the pixel array unit 3 having the pixels 2 arranged in a two-dimensional array, but in the peripheral circuit unit at the outer periphery of the pixel array unit 3.

Specifically, the twin-contact structure includes two through electrodes 271 and 272 penetrating the first semiconductor substrate 41 and the second semiconductor substrate 71, and a connecting wiring line 273 formed in the uppermost surface of the first semiconductor substrate 41. The through electrode 271 is connected to a metallic wiring line M121 of the multilayer wiring layer 73 of the second semiconductor substrate 71, and the through electrode 272 is connected to a metallic wiring line M122 of the multilayer wiring layer 232 of the third semiconductor substrate 231. The through electrode 271 and the through electrode 272 are connected by the connecting wiring line 273 on the uppermost surface of the first semiconductor substrate 41.

Further, regarding Cu—Cu metal joining, in a predetermined region 261 of the junction plane L2 between the multilayer wiring layer 73 of the second semiconductor substrate 71 and the multilayer wiring layer 232 of the third semiconductor substrate 231, one of the metallic wiring lines M101 and one of the metallic wiring lines M111 are Cu—Cu connected.

As described above, the solid-state imaging device 1 shown in FIG. 1 may have a three-layer structure in which the third semiconductor substrate 231 is further stacked, while the photodiode PD as a photoelectric conversion portion, and the charge retention portion are disposed in different semiconductor substrates that are the first semiconductor substrate 41 and the second semiconductor substrate 71.

Note that, while it is essential that the photodiode PD as a photoelectric conversion portion is disposed in the first semiconductor substrate 41 on the light incidence face side, the charge retention portion that retains electric charges in a global shutter operation may be disposed in the third semiconductor substrate 231, instead of the second semiconductor substrate 71. Alternatively, the logic circuit may be disposed in the second semiconductor substrate 71, and the charge retention portion may be disposed in the third semiconductor substrate 231.

In the description of FIG. 1, the solid-state imaging device 1 has a column AD configuration in which a signal processing circuit that performs AD conversion processes is provided for each column. However, an AD conversion circuit is not necessarily provided for each column, but may be provided for each pixel or for each unit formed with a plurality of pixels.

Further, in the examples described above, the photodiode PD as a photoelectric conversion element, the memory portion MEM that temporarily retains electric charges transferred from the photodiode PD, and the like are provided for each pixel. However, It is also possible to adopt a sharing pixel structure in which some pixel transistors are shared by a plurality of pixels. In a sharing pixel structure, the photodiode PD, the first transfer transistor Tr1 (or the transfer transistor Tr11), and the like are provided for each pixel, but the memory portion MEM as a charge retention portion, the second charge retention portion 162, the selection transistor Tr5 (Tr14), and the like are provided for each set of pixels forming a sharing unit, and are shared among the pixels.

8. Example Applications to Electronic Apparatuses

The present technology is not necessarily applied to a solid-state imaging device. Specifically, the present technology can be applied to any electronic apparatus using a solid-state imaging device as an image capturing unit (a photoelectric conversion portion), such as an imaging apparatus like a digital still camera or a video camera, a mobile terminal device having an imaging function, or a copying machine using a solid-state imaging device as the image reader. A solid-state imaging device may be in the form of a single chip, or may be in the form of a module that is formed by packaging an imaging unit and a signal processing unit or an optical system, and has an imaging function.

Figure 13:
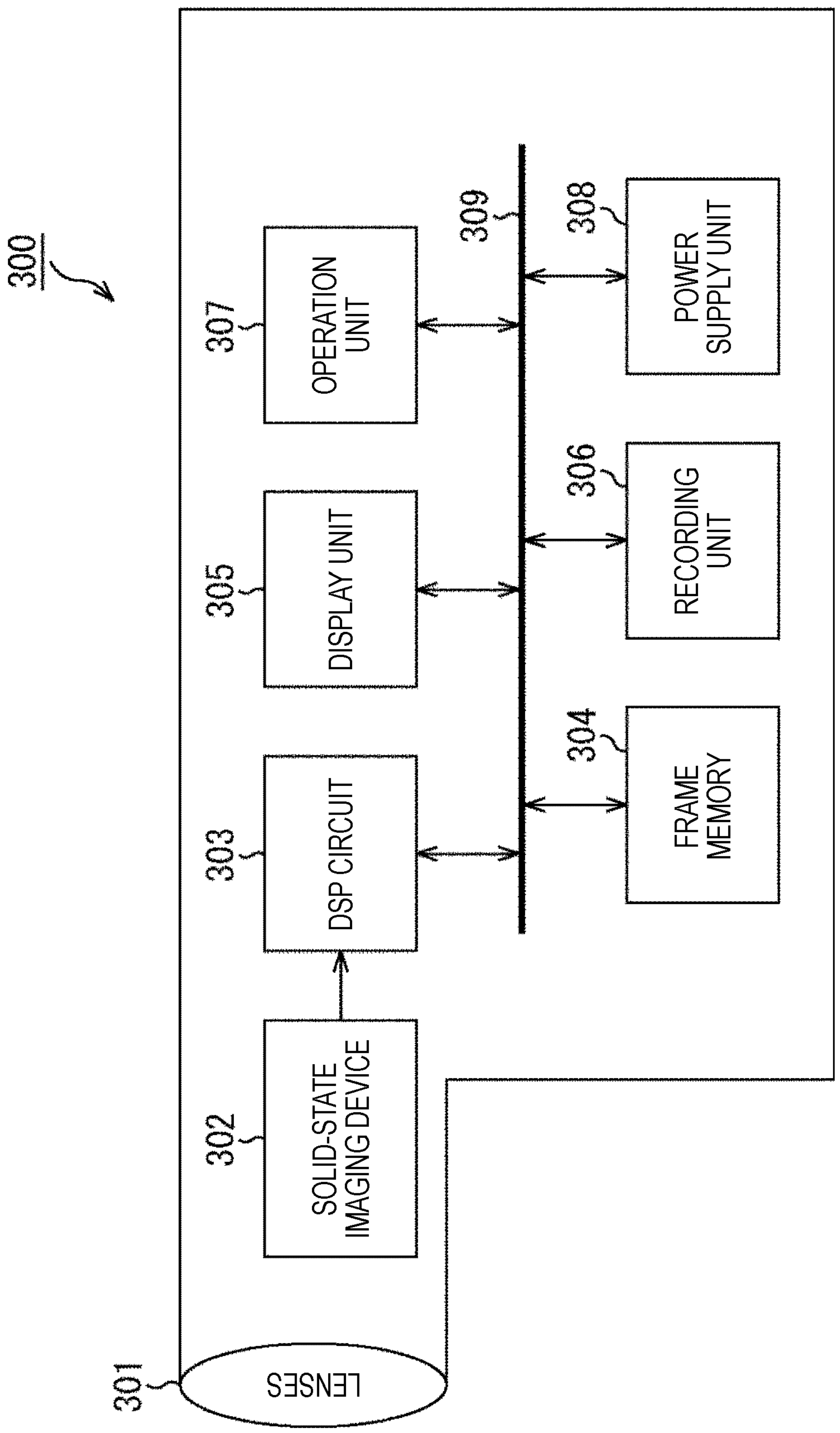
FIG. 13 is a block diagram showing an example configuration of an imaging apparatus as an electronic apparatus to which the present technology is applied.

FIG. 13 is a block diagram showing an example configuration of an imaging apparatus as an electronic apparatus to which the present technology is applied.

An imaging apparatus 300 shown in FIG. 13 includes an optical unit 301 formed with lenses and the like, a solid-state imaging device (an imaging device) 302 that adopts the configuration of the solid-state imaging device 1 shown in FIG. 1, and a digital signal processor (DSP) circuit 303 that is a camera signal processing circuit. The imaging apparatus 300 also includes a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are connected to one another via a bus line 309.

The optical unit 301 gathers incident light (image light) from an object, and forms an image on the imaging surface of the solid-state imaging device 302. The solid-state imaging device 302 converts the amount of the incident light, which has been gathered as the image on the imaging surface by the optical unit 301, into an electrical signal for each pixel, and outputs the electrical signal as a pixel signal. As the solid-state imaging device 302, it is possible to use the solid-state imaging device 1 shown in FIG. 1, which is a solid-state imaging device that has the photodiode PD as a photoelectric conversion portion and the charge retention portion that retains electric charges in a global shutter operation in different semiconductor substrates, and enables miniaturization of pixels.

The display unit 305 is formed with a flat-panel display such as a liquid crystal display (LCD) or an organic electroluminescence (EL) display, for example, and displays a moving image or a still image formed by the solid-state imaging device 302. The recording unit 306 records the moving image or the still image formed by the solid-state imaging device 302 on a recording medium such as a hard disk or a semiconductor memory.

When operated by a user, the operation unit 307 issues operating instructions as to various functions of the imaging apparatus 300. The power supply unit 308 supplies various power sources as the operation power sources for the DSP circuit 303, the frame memory 304, the display unit 305, the recording unit 306, and the operation unit 307, as appropriate.

As described above, the solid-state imaging device 1 to which each of embodiments described above is applied is used as the solid-state imaging device 302, so that the PLS characteristics can be enhanced. Furthermore, as elements are formed in the second semiconductor substrate after the first semiconductor substrate including the photoelectric conversion portion and the second semiconductor substrate including the charge retention portion are bonded to each other, the element can be miniaturized. Accordingly, it is also possible to achieve high image quality and downsizing of captured images in the imaging apparatus 300 such as a video camera, a digital still camera, and a camera module for mobile devices like portable telephones.

Examples of Use of an Image Sensor

Figure 14:
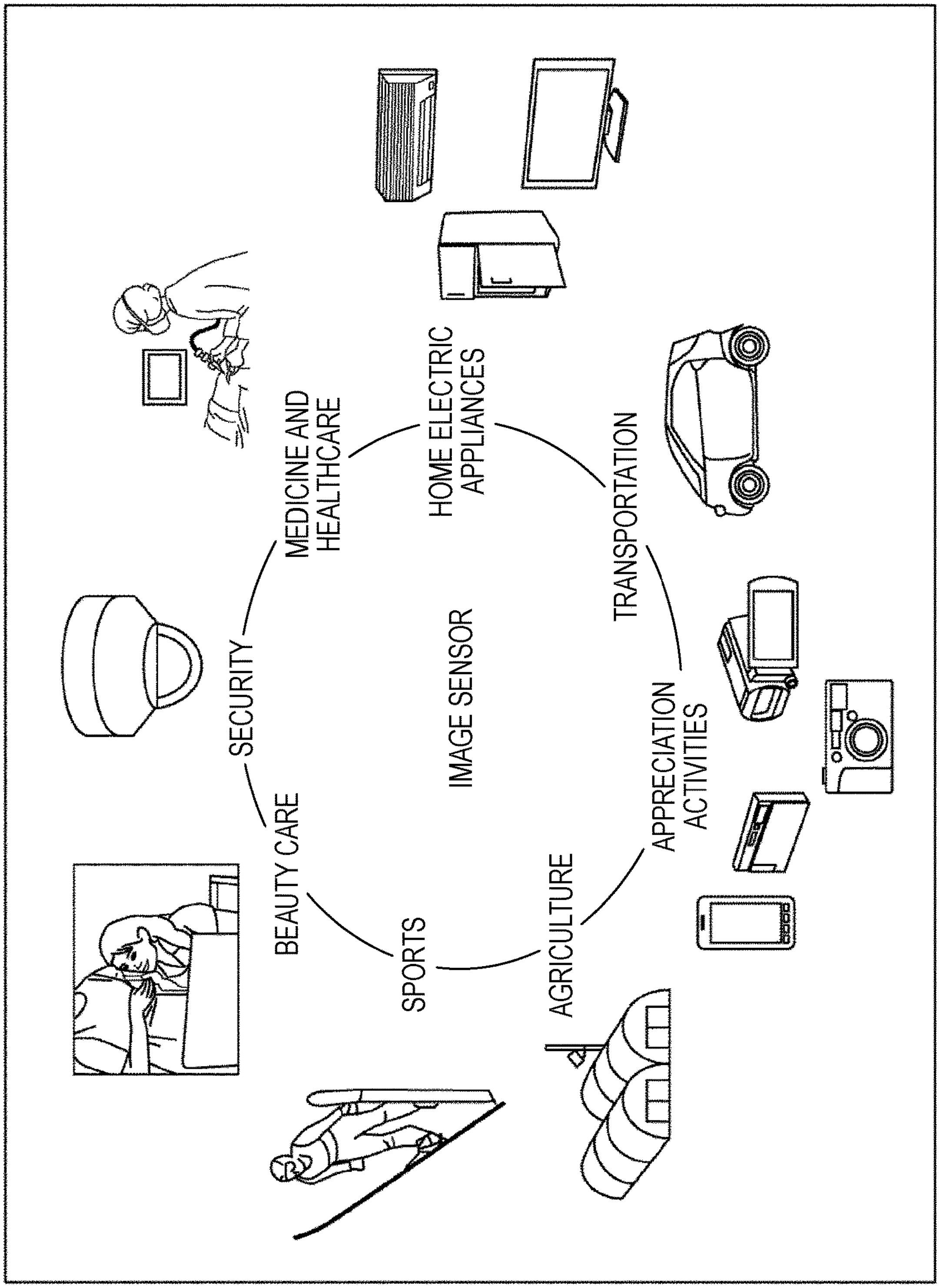
FIG. 14 is a diagram for explaining examples of use of an image sensor.

FIG. 14 is a diagram showing examples of use of an image sensor using the solid-state imaging device 1 described above.

An image sensor using the solid-state imaging device 1 described above can be used in various cases where light, such as visible light, infrared light, ultraviolet light, or X-rays, is to be sensed, as listed below, for example.

- Devices configured to take images for appreciation activities, such as digital cameras and portable devices with camera functions.
- Devices for transportation use, such as vehicle-mounted sensors configured to take images of the front, the back, the surroundings, the inside, and the like of an automobile to perform safe driving such as an automatic stop and recognize the driver's condition and the like, surveillance cameras for monitoring running vehicles and roads, and ranging sensors for measuring distances between vehicles or the like.
- Devices to be used in conjunction with home electric appliances, such as television sets, refrigerators, and air conditioners, to take images of gestures of users and operate the appliances in accordance with the gestures.
- Devices for medical care use and health care use, such as endoscopes and devices for receiving infrared light for angiography.
- Devices for security use, such as surveillance cameras for crime prevention and cameras for personal authentication.
- Devices for beauty care use, such as skin measurement devices configured to image the skin and microscopes for imaging the scalp.
- Devices for sporting use, such as action cameras and wearable cameras for sports and the like.
- Devices for agricultural use such as cameras for monitoring conditions of fields and crops.

9. Example Application to an In-Vivo Information Acquisition System

The technology (the present technology) according to the present disclosure can be applied to various products. For example, the technology according to the present disclosure may be applied to a patient in-vivo information acquisition system that uses a capsule endoscope.

Figure 15:
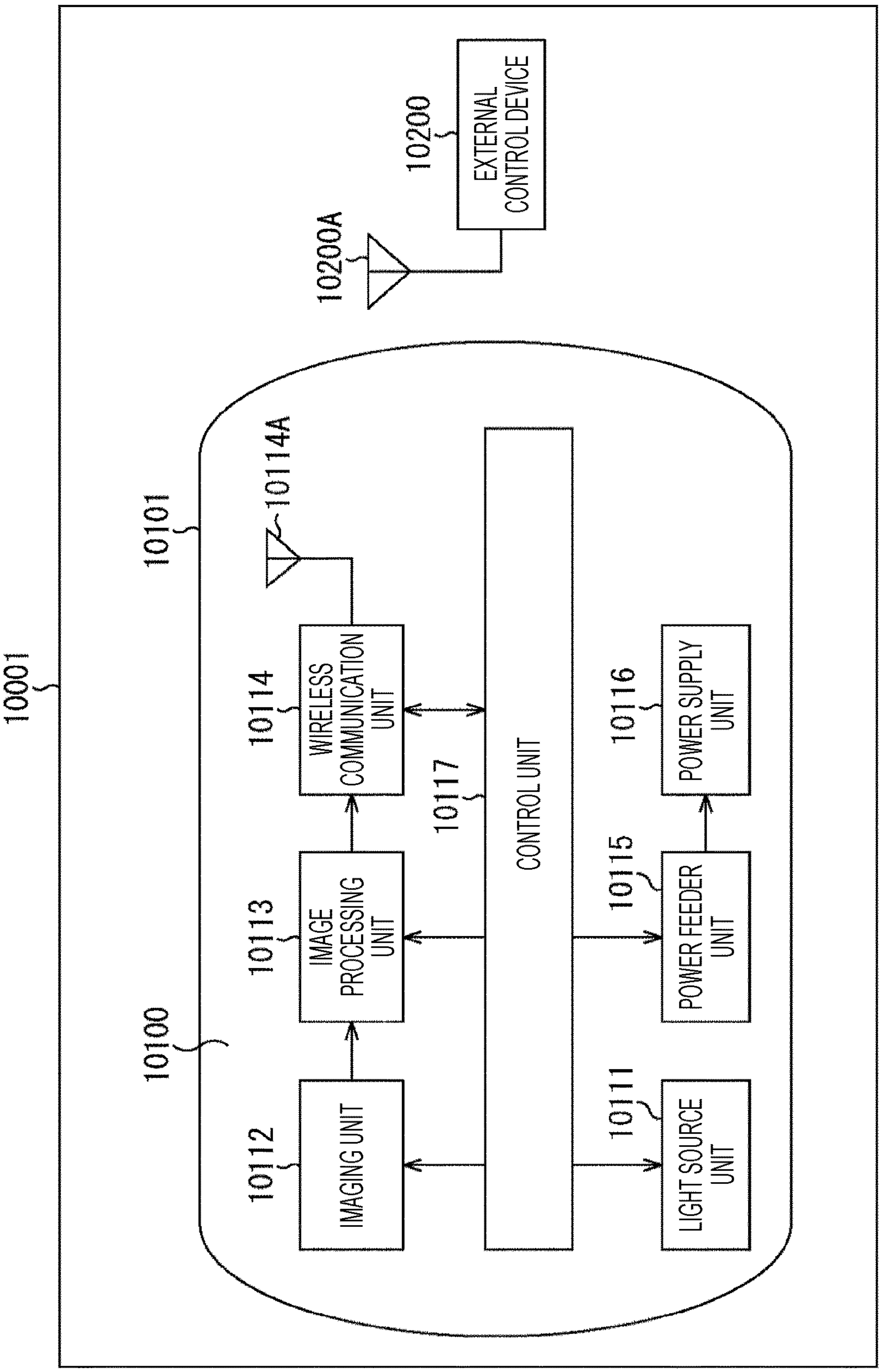
FIG. 15 is a block diagram schematically showing an example configuration of an in-vivo information acquisition system.

FIG. 15 is a block diagram schematically showing an example configuration of a patient's in-vivo information acquisition system using a capsule endoscope to which the technology (the present technology) according to the present disclosure may be applied.

An in-vivo information acquisition system 10001 includes a capsule endoscope 10100 and an external control device 10200.

The capsule endoscope 10100 is swallowed by the patient at the time of examination. The capsule endoscope 10100 has an imaging function and a wireless communication function. Before naturally discharged from the patient, the capsule endoscope 10100 moves inside the internal organs such as the stomach and the intestines by peristaltic motion or the like, sequentially captures images of the inside of the internal organs (these images will be hereinafter also referred to as in-vivo images) at predetermined intervals, and sequentially transmits information about the in-vivo images to the external control device 10200 outside the body in a wireless manner.

Further, the external control device 10200 controls the overall operation of the in-vivo information acquisition system 10001. The external control device 10200 also receives the information about the in-vivo images transmitted from the capsule endoscope 10100, and, on the basis of the received in-vivo image information, generates image data for displaying the in-vivo images on a display device (not shown).

In this manner, the in-vivo information acquisition system 10001 can acquire in-vivo images showing the states of the inside of the body of the patient at any appropriate time until the swallowed capsule endoscope 10100 is discharged.

The configurations and the functions of the capsule endoscope 10100 and the external control device 10200 are now described in greater detail.

The capsule endoscope 10100 has a capsule-like housing 10101, and the housing 10101 houses a light source unit 10111, an imaging unit 10112, an image processing unit 10113, a wireless communication unit 10114, a power feeder unit 10115, a power supply unit 10116, and a control unit 10117.

The light source unit 10111 is formed with a light source such as a light emitting diode (LED), for example, and emits light onto the imaging field of view of the imaging unit 10112.

The imaging unit 10112 is formed with an imaging device and an optical system including a plurality of lenses provided in front of the imaging device. Reflected light of light emitted to body tissue as the current observation target (this reflected light will be hereinafter referred to as the observation light) is collected by the optical system, and enters the imaging device. In the imaging unit 10112, the observation light incident on the imaging device is photoelectrically converted, and an image signal corresponding to the observation light is generated. The image signal generated by the imaging unit 10112 is supplied to the image processing unit 10113.

The image processing unit 10113 is formed with a processor such as a central processing unit (CPU) or a graphics processing unit (GPU), and performs various kinds of signal processing on the image signal generated by the imaging unit 10112. The image processing unit 10113 supplies the image signal subjected to the signal processing as RAW data to the wireless communication unit 10114.

Further, the wireless communication unit 10114 performs predetermined processing such as modulation processing on the image signal subjected to the signal processing by the image processing unit 10113, and transmits the image signal to the external control device 10200 via an antenna 10114A. The wireless communication unit 10114 also receives a control signal related to control of driving of the capsule endoscope 10100 from the external control device 10200 via the antenna 10114A. The wireless communication unit 10114 supplies the control signal received from the external control device 10200 to the control unit 10117.

The power feeder unit 10115 includes an antenna coil for power reception, a power regeneration circuit that regenerates electric power from the current generated in the antenna coil, a booster circuit, and the like. In the power feeder unit 10115, electric power is generated according to a so-called non-contact charging principle.

The power supply unit 10116 is formed with a secondary battery, and stores the electric power generated by the power feeder unit 10115. In FIG. 15, to avoid complication of the drawing, an arrow or the like indicating the destination of power supply from the power supply unit 10116 is not shown. However, the electric power stored in the power supply unit 10116 is supplied to the light source unit 10111, the imaging unit 10112, the image processing unit 10113, the wireless communication unit 10114, and the control unit 10117, and can be used for driving these units.

The control unit 10117 is formed with a processor such as a CPU, and drives the light source unit 10111, the imaging unit 10112, the image processing unit 10113, the wireless communication unit 10114, and the power feeder unit 10115 unit as appropriate in accordance with a control signal transmitted from the external control device 10200.

The external control device 10200 is formed with a processor such as a CPU or a GPU, or a microcomputer, a control board, or the like on which a processor and a storage element such as a memory are mounted together. The external control device 10200 controls operation of the capsule endoscope 10100 by transmitting a control signal to the control unit 10117 of the capsule endoscope 10100 via an antenna 10200A. In the capsule endoscope 10100, the conditions for emitting light to the current observation target in the light source unit 10111 can be changed in accordance with the control signal from the external control device 10200, for example. Further, the imaging conditions (such as the frame rate and the exposure value in the imaging unit 10112, for example) can also be changed in accordance with the control signal from the external control device 10200. Further, the contents of the processing in the image processing unit 10113 and the conditions (such as the transmission intervals and the number of images to be transmitted, for example) for the wireless communication unit 10114 to transmit image signals may be changed in accordance with the control signal from the external control device 10200.

Further, the external control device 10200 also performs various kinds of image processing on the image signal transmitted from the capsule endoscope 10100, and generates image data for displaying a captured in-vivo image on the display device. Examples of the image processing include various kinds of signal processing, such as a development process (a demosaicing process), an image quality enhancement process (a band emphasizing process, a super-resolution process, a noise reduction (NR) process, a camera shake correction process, and/or the like), and/or an enlargement process (an electronic zooming process), for example. The external control device 10200 controls driving of the display device, to cause the display device to display an in-vivo image captured on the basis of the generated image data. Alternatively, the external control device 10200 may cause a recording device (not shown) to record the generated image data, or cause a printing device (not shown) to print out the generated image data.

An example of an in-vivo information acquisition system to which the technology according to the present disclosure can be applied has been described above. The technology according to the present disclosure can be applied to the imaging unit 10112 in the above described configuration. Specifically, the solid-state imaging device 1 described above can be used as the imaging unit 10112. As the technology according to the present disclosure is applied to the imaging unit 10112, the capsule endoscope 10100 can be made smaller, and thus, the burden on the patient can be further reduced. Furthermore, clearer images of the surgical site can be obtained, while the capsule endoscope 10100 is made smaller. Thus, the accuracy of examination is increased.

10. Example Application to an Endoscopic Surgery System

The technology (the present technology) according to the present disclosure can be applied to various products. For example, the technology according to the present disclosure may be applied to an endoscopic surgery system.

Figure 16:
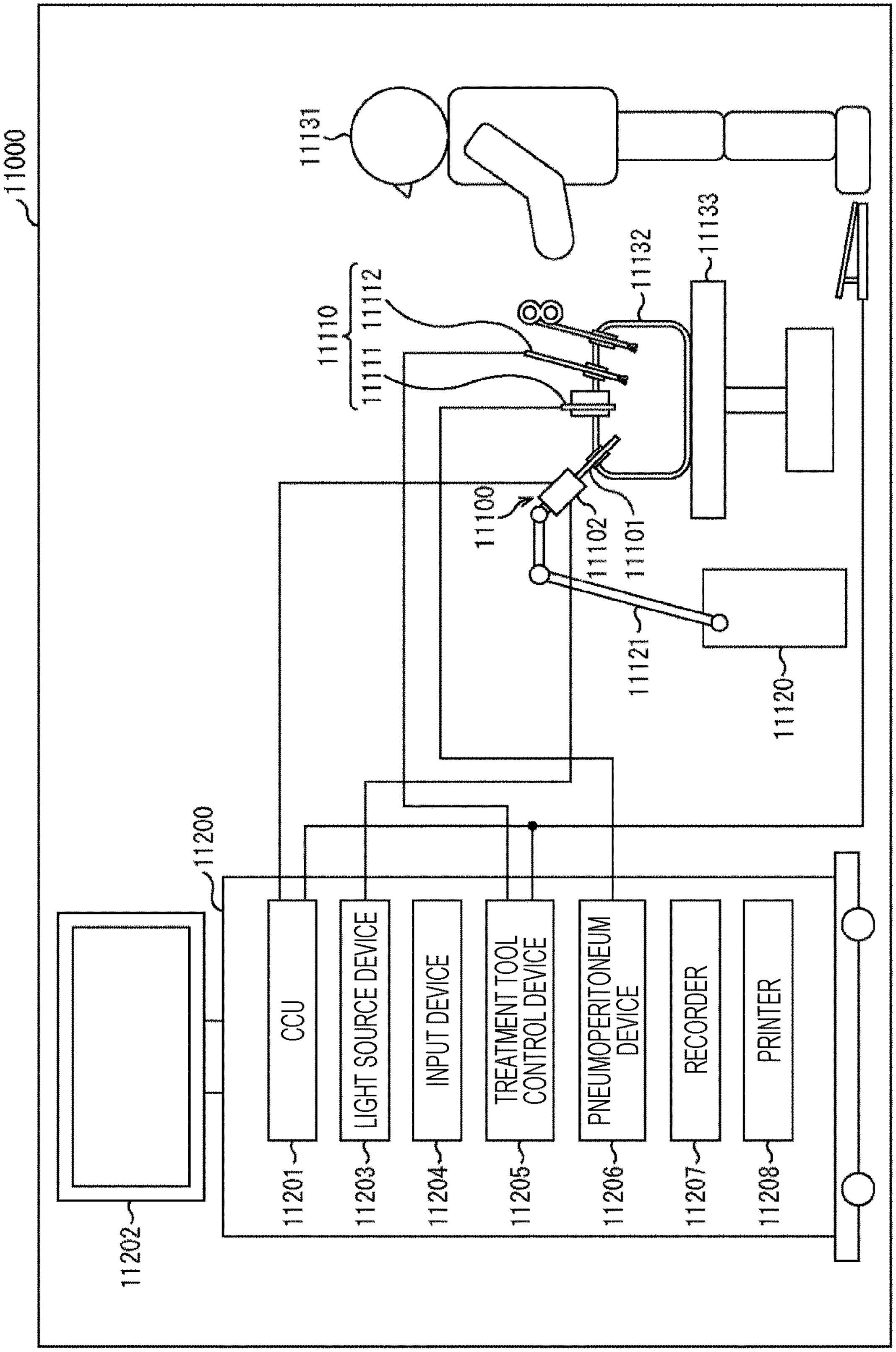
FIG. 16 is a diagram schematically showing an example configuration of an endoscopic surgery system.

FIG. 16 is a diagram schematically showing an example configuration of an endoscopic surgery system to which the technology (the present technology) according to the present disclosure may be applied.

FIG. 16 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is configured as a so-called rigid scope having a rigid lens barrel 11101. However, the endoscope 11100 may be configured as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrow band imaging is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

Figure 17:
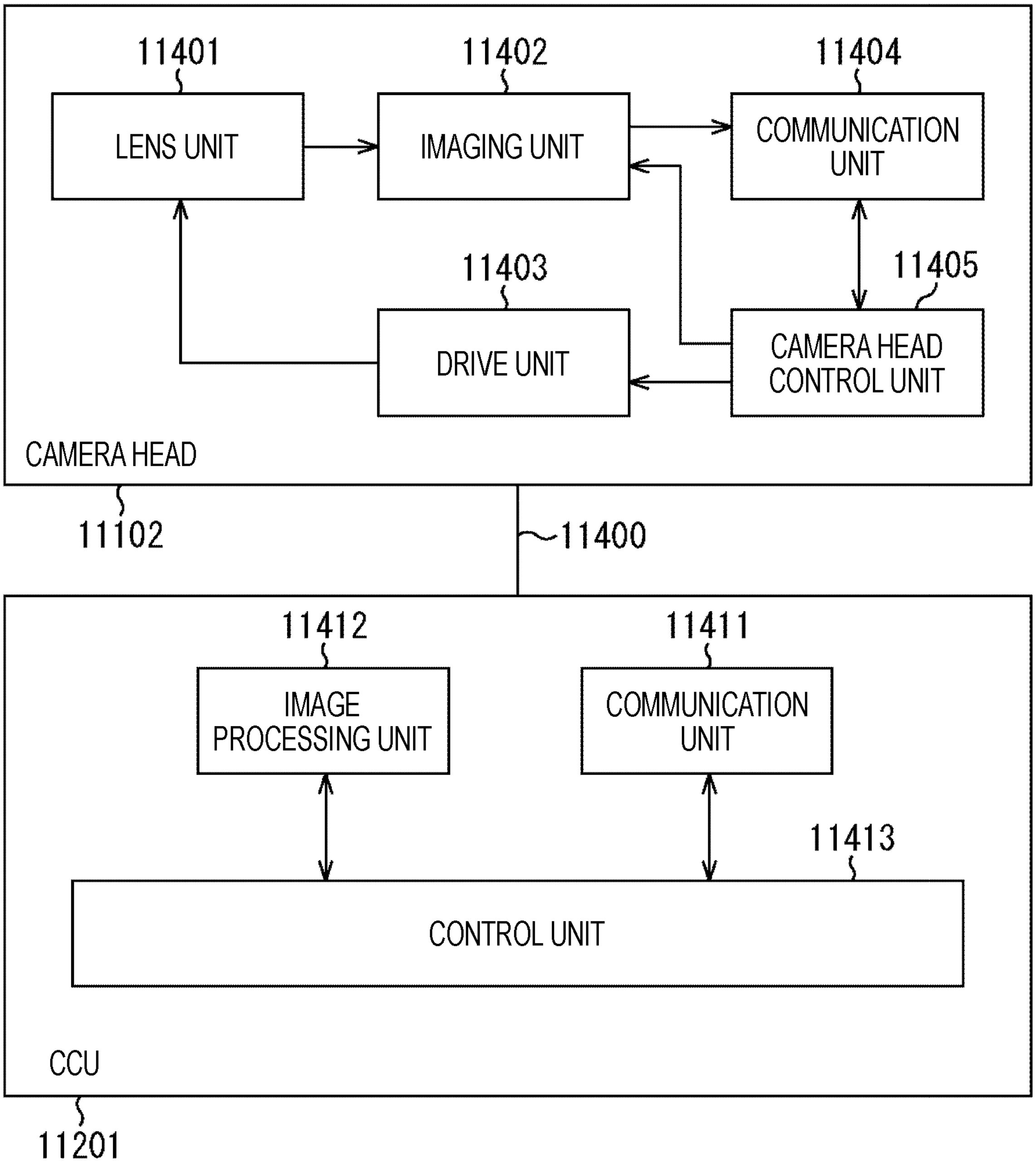
FIG. 17 is a block diagram showing an example of the functional configurations of a camera head and a CCU.

FIG. 17 is a block diagram showing an example of the functional configurations of the camera head 11102 and the CCU 11201 shown in FIG. 16.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 is provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be appropriately adjusted.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

Further, the communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

An example of an endoscopic surgery system to which the technique according to the present disclosure can be applied has been described above. The technology according to the present disclosure can be applied to the imaging unit 11402 of the camera head 11102, among the configurations described above. Specifically, the solid-state imaging device 1 described above can be applied as the imaging unit 11402. As the technology according to the present disclosure is applied to the imaging unit 11402, it is possible to obtain a clearer surgical site image, while reducing the size of the camera head 11102.

Note that, although an endoscopic surgery system has been described as an example herein, the technique according to the present disclosure may be applied to some other system, such as a microscopic surgery system, for example.

11. Example Applications to Mobile Structures

The technology (the present technology) according to the present disclosure can be applied to various products. For example, the technology according to the present disclosure may be embodied as an apparatus mounted on any type of mobile structure, such as an automobile, an electrical vehicle, a hybrid electrical vehicle, a motorcycle, a bicycle, a personal mobility device, an airplane, a drone, a vessel, or a robot.

Figure 18:
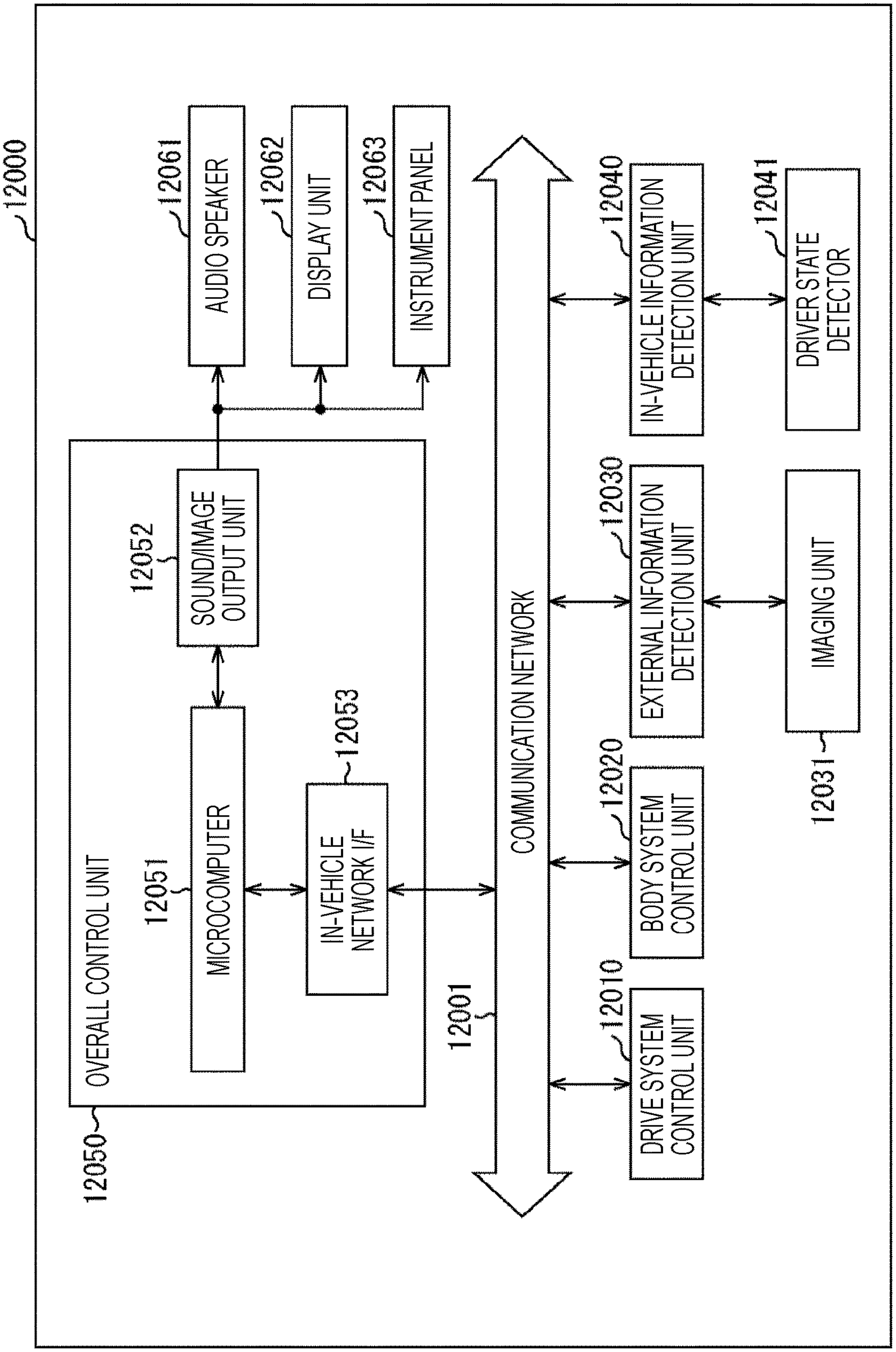
FIG. 18 is a block diagram schematically showing an example configuration of a vehicle control system.

FIG. 18 is a block diagram schematically showing an example configuration of a vehicle control system that is an example of a mobile structure control system to which the technology according to the present disclosure may be applied.

A vehicle control system 12000 includes a plurality of electronic control units connected via a communication network 12001. In the example shown in FIG. 18, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

Further, the microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 18, an audio speaker 12061, a display unit 12062, and an instrument panel 12063 are shown as output devices. The display unit 12062 may include an on-board display and/or a head-up display, for example.

Figure 19:
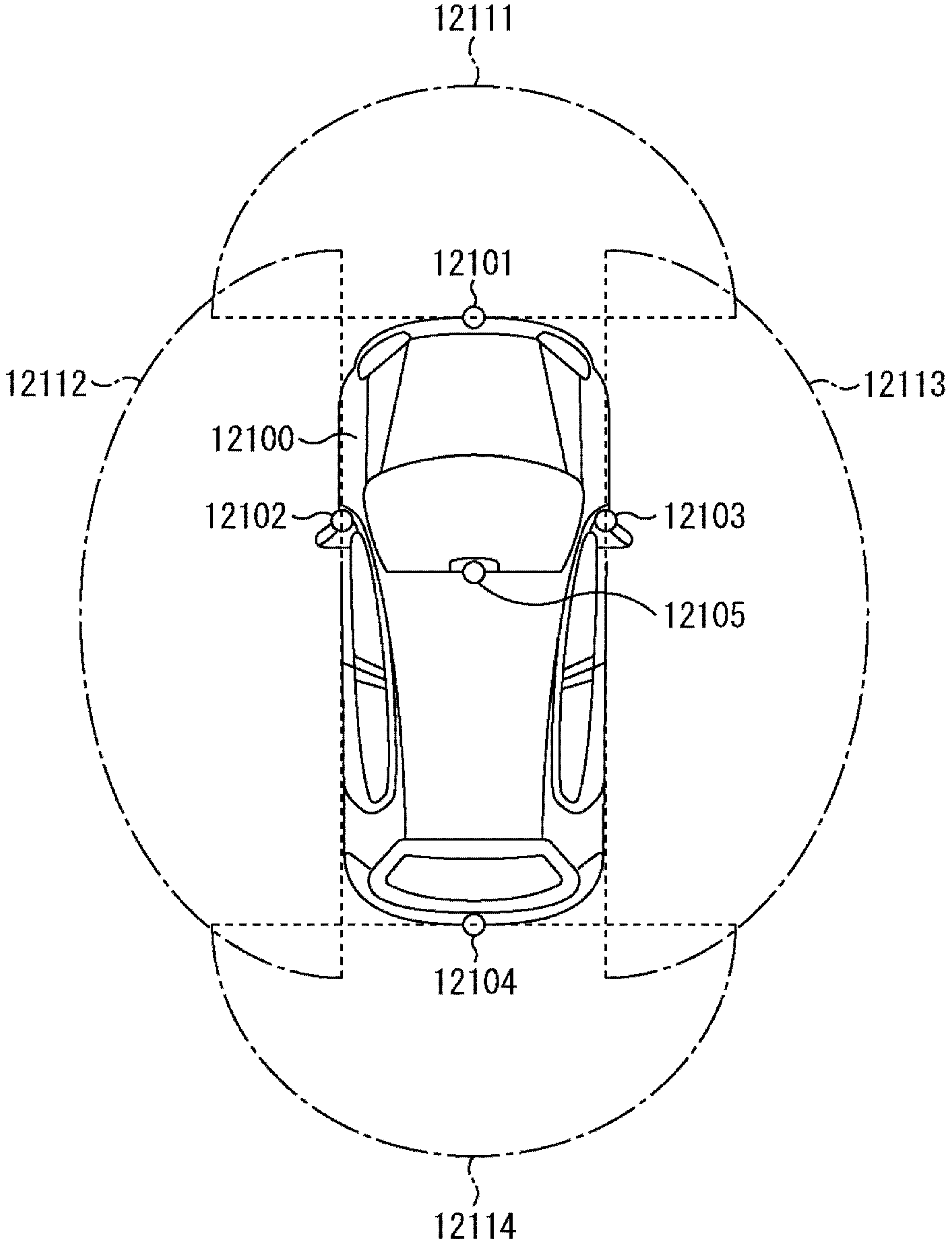
FIG. 19 is an explanatory diagram showing an example of installation positions of external information detectors and imaging units.

FIG. 19 is a diagram showing an example of installation positions of imaging units 12031.

In FIG. 19, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, an upper portion, and the like of the front windshield inside the vehicle, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 19 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. Then, the microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

An example of a vehicle control system to which the technology according to the present disclosure can be applied has been described above. The technology according to the present disclosure can be applied to the imaging unit 12031 in the above described configuration. Specifically, the solid-state imaging device 1 described above can be applied as the imaging unit 12031. As the technology according to the present disclosure is applied to the imaging unit 12031, it is possible to obtain a more easier-to-view captured image and obtain distance information, while reducing the size. It is also possible to reduce the driver's fatigue and increase the degree of safety of the driver and the vehicle, using the obtained captured image and distance information.

In the solid-state imaging devices in the above described examples, the first conductivity type is the p-type, the second conductivity type is the n-type, and electrons are used as signal charges. However, the present technology can also be applied to solid-state imaging devices in which holes are used as signal charges. That is, the first conductivity type can be the n-type, the second conductivity type can be the p-type, and the conductivity types of the above described respective semiconductor regions can be reversed.

The present technology can also be applied not only to solid-state imaging devices that sense an incident light quantity distribution of visible light and form an image in accordance with the distribution, but also to solid-state imaging devices (physical quantity distribution sensors) in general, such as a solid-state imaging device that senses an incident quantity distribution of infrared rays, X-rays, particles, or the like, and forms an image in accordance with the distribution, or a fingerprint sensor that senses a distribution of some other physical quantity in a broad sense, such as pressure or capacitance, and forms an image in accordance with the distribution.

Embodiments of the present technology are not limited to the above described embodiments, and various modifications may be made to them without departing from the scope of the present technology.

For example, it is possible to adopt a combination of all or some of the embodiments described above.

Note that the advantageous effects described in this specification are merely examples, and the advantageous effects of the present technology are not limited to them and may include effects other than those described in this specification.

Note that the present technology may also be embodied in the configurations described below.

(1)

A solid-state imaging device including:

a first semiconductor substrate and a second semiconductor substrate, a front surface side as a wiring layer formation surface of the first semiconductor substrate being joined to a back surface side of the second semiconductor substrate on the opposite side from a wiring layer formation surface of the second semiconductor substrate, the first semiconductor substrate including:

a photoelectric conversion portion that photoelectrically converts incident light; and a transfer transistor that transfers an electric charge of the photoelectric conversion portion, the second semiconductor substrate including a charge/voltage retention portion that retains the electric charge transferred by the transfer transistor or a voltage corresponding to the electric charge; and a through electrode that penetrates the second semiconductor substrate, and transmits the electric charge transferred from the transfer transistor or the voltage to the charge/voltage retention portion.

(2)

The solid-state imaging device according to (1), in which the first semiconductor substrate further includes a light blocking film formed with a metallic wiring line that is part of a wiring layer.

(3)

The solid-state imaging device according to (1) or (2), in which the first semiconductor substrate further includes a charge-voltage conversion portion that generates the voltage corresponding to the electric charge, and the charge/voltage retention portion of the second semiconductor substrate holds the voltage converted by the charge-voltage conversion portion.

(4)

The solid-state imaging device according to any one of (1) to (3), in which a cross-sectional diameter of the through electrode at a junction plane between the first semiconductor substrate and the second semiconductor substrate is smaller than or the same as a cross-sectional diameter of a portion penetrating the second semiconductor substrate.

(5)

The solid-state imaging device according to any one of (1) to (4), in which, in a pixel region, the first semiconductor substrate and the second semiconductor substrate are electrically connected only by a plurality of through electrodes.

(6)

The solid-state imaging device according to any one of (1) to (5), in which a metallic wiring line of a wiring layer of the first semiconductor substrate includes tungsten.

(7)

A method for manufacturing a solid-state imaging device, the method including:

forming a photoelectric conversion portion and a transfer transistor in a first semiconductor substrate, the photoelectric conversion portion photoelectrically converting incident light, the transfer transistor transferring an electric charge of the photoelectric conversion portion;

bonding a front surface side as a wiring layer formation surface of the first semiconductor substrate to a back surface side of the second semiconductor substrate on the opposite side from a wiring layer formation surface of the second semiconductor substrate;

forming a charge/voltage retention portion in the second semiconductor substrate after the bonding, the charge/voltage retention portion retaining the electric charge transferred by the transfer transistor or a voltage corresponding to the electric charge; and forming a through electrode that penetrates the second semiconductor substrate, and transmits the electric charge transferred from the transfer transistor or the voltage to the charge/voltage retention portion.

(8)

An electronic apparatus including a solid-state imaging device including:

a first semiconductor substrate and a second semiconductor substrate, a front surface side as a wiring layer formation surface of the first semiconductor substrate being joined to a back surface side of the second semiconductor substrate on the opposite side from a wiring layer formation surface of the second semiconductor substrate, the first semiconductor substrate including:

a photoelectric conversion portion that photoelectrically converts incident light; and a transfer transistor that transfers an electric charge of the photoelectric conversion portion, the second semiconductor substrate including:

a charge/voltage retention portion that retains the electric charge transferred by the transfer transistor or a voltage corresponding to the electric charge; and a through electrode that penetrates the second semiconductor substrate, and transmits the electric charge transferred from the transfer transistor or the voltage to the charge/voltage retention portion.

REFERENCE SIGNS LIST

1 Solid-state imaging device
2 Pixel
3 Pixel array unit
41 First semiconductor substrate
43 Wiring layer
71 Second semiconductor substrate
73 Multilayer wiring layer
91, 92, 98, 99 Through electrode Tr1 First transfer transistor
M4 Metallic wiring line
MEM Memory unit
PD Photodiode
Tr11 Transfer transistor
Tr13 First amplification transistor
300 Imaging apparatus
302 Solid-state imaging device

The invention claimed is:

1. A solid-state imaging apparatus, comprising:
- a first semiconductor substrate;
- a second semiconductor substrate,
- wherein a front surface side of the first semiconductor substrate forms a wiring layer formation surface of the first semiconductor substrate and joins to a back surface side of the second semiconductor substrate which is an opposite side of a wiring layer formation surface of the second semiconductor substrate,
- wherein the first semiconductor substrate includes:
  - a photoelectric conversion portion that photoelectrically converts incident light;
  - a transfer transistor that transfers electric charges of the photoelectric conversion portion; and
  - a voltage conversion transistor that converts the electric charges transferred by the transfer transistor into a corresponding voltage, and
- wherein the second semiconductor substrate includes a charge voltage retention portion that retains the corresponding voltage converted by the voltage conversion transistor; and
- a through electrode that penetrates through the second semiconductor substrate and transmits the corresponding voltage converted by the transfer transistor to the charge voltage retention portion,
- wherein the transfer transistor and the voltage conversion transistor are formed on a surface of the second semiconductor substrate, opposite a light incident side of the first semiconductor substrate and
- wherein the through electrode does not penetrate through the first semiconductor substrate.

2. The solid-state imaging apparatus according to claim 1, further comprising a photomask arranged between the first semiconductor substrate and the second semiconductor substrate, wherein the photomask is formed by a portion of a metal wiring provided within a wiring layer.

3. The solid-state imaging apparatus according to claim 1, wherein a cross-sectional diameter of the through electrode penetrating both the first semiconductor substrate and the second semiconductor substrate is less than or equal to the cross-sectional diameter of the through electrode penetrating only the second semiconductor substrate.

4. The solid-state imaging apparatus according to claim 1, wherein the charge voltage retention portion of the second semiconductor substrate includes a capacitor.

5. The solid-state imaging apparatus according to claim 1, wherein the first semiconductor substrate and the second semiconductor substrate are electrically coupled only via a plurality of the through electrodes provided within a pixel region of the solid-state imaging apparatus.

6. The solid-state imaging apparatus according to claim 1, wherein the transfer transistor and the voltage conversion transistor are provided between the wiring layer formation surface of the first semiconductor substrate and the wiring layer formation surface of the second semiconductor substrate.

7. The solid-state imaging apparatus according to claim 1, further comprising a light blocking film positioned below the photoelectric conversion portion and above the through electrode throughout a length of the through electrode in a cross-sectional view.

8. The solid-state imaging apparatus according to claim 7, wherein the light blocking film includes tungsten.

9. A manufacturing method for a solid-state imaging apparatus, the method comprising:
- forming a photoelectric conversion portion, a transfer transistor, and a voltage conversion transistor in a first semiconductor substrate,
- wherein the photoelectric conversion portion photoelectrically converts incident light, wherein the transfer transistor transfers electric charges of the photoelectric conversion portion and
- wherein the voltage conversion transistor converts the electric charges transferred by the transfer transistor into a corresponding voltage;
- bonding a front surface side of the first semiconductor substrate which is a wiring layer formation surface of the first semiconductor substrate to a back surface side of a second semiconductor substrate which is an opposite side of a wiring layer formation surface of the second semiconductor substrate;
- forming a charge voltage retention portion in the second semiconductor substrate after the bonding,
- wherein the charge voltage retention portion retains the corresponding voltage converted by the voltage conversion transistor;
- forming a through electrode that penetrates the second semiconductor substrate and transmits the corresponding voltage converted by the transfer transistor to the charge voltage retention portion;
- forming the transfer transistor and the voltage conversion transistor on a surface of the second semiconductor substrate, opposite a light incident side of the first semiconductor substrate; and
- not penetrating the first semiconductor substrate with the through electrode.

10. The manufacturing method for a solid-state imaging apparatus according to claim 9, wherein the method further comprises:
- arranging a photomask between the first semiconductor substrate and the second semiconductor substrate; and
- forming the photomask by a portion of a metal wiring provided within a wiring layer.

11. The manufacturing method for a solid-state imaging apparatus according to claim 9, wherein a cross-sectional diameter of the through electrode penetrating both the first semiconductor substrate and the second semiconductor substrate is less than or equal to the cross-sectional diameter of the through electrode penetrating only the second semiconductor substrate.

12. The manufacturing method for a solid-state imaging apparatus according to claim 9, wherein the charge voltage retention portion of the second semiconductor substrate includes a capacitor.

13. The manufacturing method for a solid-state imaging apparatus according to claim 9, wherein the method further comprises electrically coupling the first semiconductor substrate and the second semiconductor substrate only via a plurality of the through electrodes provided within a pixel region of the solid-state imaging apparatus.

14. An electronic apparatus including a solid-state imaging apparatus, the electronic apparatus comprising:

an optical system;

a solid-state imaging apparatus that receives light from the optical system, the solid-state imaging apparatus comprising:

a first semiconductor substrate;

a second semiconductor substrate, wherein a front surface side of the first semiconductor substrate forms a wiring layer formation surface of the first semiconductor substrate and joins to a back surface side of the second semiconductor substrate which is an opposite side of a wiring layer formation surface of the second semiconductor substrate, wherein the first semiconductor substrate includes:

a photoelectric conversion portion that photoelectrically converts incident light;

a transfer transistor that transfers electric charges of the photoelectric conversion portion; and a voltage conversion transistor that converts the electric charges transferred by the transfer transistor into a corresponding voltage, and wherein the second semiconductor substrate includes a charge voltage retention portion that retains the corresponding voltage converted by the voltage conversion transistor; and a through electrode that penetrates through the second semiconductor substrate and transmits the corresponding voltage converted by the transfer transistor to the charge voltage retention portion, wherein the transfer transistor and the voltage conversion transistor are formed on a surface of the second semiconductor substrate, opposite a light incident side of the first semiconductor substrate and wherein the through electrode does not penetrate through the first semiconductor substrate; and a digital signal processor that processes signals received from the solid-state imaging apparatus.

15. The electronic apparatus according to claim 14, further comprising a photomask arranged between the first semiconductor substrate and the second semiconductor substrate, wherein the photomask is formed by a portion of a metal wiring provided within a wiring layer.

16. The electronic apparatus according to claim 14, wherein a cross-sectional diameter of the through electrode penetrating both the first semiconductor substrate and the second semiconductor substrate is less than or equal to the cross-sectional diameter of the through electrode penetrating only the second semiconductor substrate.

17. The electronic apparatus according to claim 14, wherein the charge voltage retention portion of the second semiconductor substrate includes a capacitor.

18. The electronic apparatus according to claim 14, wherein the first semiconductor substrate and the second semiconductor substrate are electrically coupled only via a plurality of the through electrodes provided within a pixel region of the solid-state imaging apparatus.

19. The electronic apparatus according to claim 14, further comprising a light blocking film positioned below the photoelectric conversion portion and above the through electrode throughout a length of the through electrode in a cross-sectional view.

20. The electronic apparatus according to claim 19, wherein the light blocking film includes tungsten.

* * * * *